(12) United States Patent
Lo et al.

(10) Patent No.: US 10,403,612 B2
(45) Date of Patent: Sep. 3, 2019

(54) DUAL-SIDED DISPLAY AND METHOD FOR FABRICATING THE SAME

(71) Applicant: AU Optronics Corporation, Hsin-Chu (TW)

(72) Inventors: Kuo-Lung Lo, Hsin-Chu (TW); Wen-Wei Yang, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 16/039,518

(22) Filed: Jul. 19, 2018

(65) Prior Publication Data

US 2019/0035773 A1    Jan. 31, 2019

(30) Foreign Application Priority Data

Jul. 26, 2017    (TW) .............................. 106125181 A

(51) Int. Cl.
*H01L 51/52* (2006.01)
*H01L 25/16* (2006.01)
(Continued)

(52) U.S. Cl.
CPC ........ *H01L 25/167* (2013.01); *H01L 25/0753* (2013.01); *H01L 27/1248* (2013.01);
(Continued)

(58) Field of Classification Search
CPC ........ G02F 2001/133342; G02F 2001/136231; G02F 2001/6236; G02F 2001/136245; G02F 2001/136281; G02F 2001/13629; G02F 2001/136295; G02F 2001/13685; G02F 1/1514–1523; G02F 1/13353; G02F 1/1362–1368; H01L 27/3267; H01L 27/3248; H01L 27/326; H01L 27/32–3297; H01L 27/1214–1296;
(Continued)

(56) References Cited

U.S. PATENT DOCUMENTS 8,198,109 B2    6/2012  Lerman et al.
9,362,334 B2    6/2016  Zhang et al.
(Continued)

FOREIGN PATENT DOCUMENTS

CN    1805149 A    7/2006

*Primary Examiner* — Eric A. Ward
*Assistant Examiner* — Eric K Ashbahian
(74) *Attorney, Agent, or Firm* — WPAT, PC

(57) ABSTRACT

A dual-sided display is disclosed, including a substrate, a first active device, a first micro light emitting device, a patterned photoresist layer, a reflective electrode, a second micro light emitting device, a protective layer, and a first conductive electrode. The first micro light emitting device is disposed on the substrate and electrically connected to the first active device. The patterned photoresist layer is disposed on the substrate and covers a portion of the first micro light emitting device. The reflective electrode covers the patterned photoresist layer and a portion of the substrate. The second micro light emitting device is disposed on the reflective electrode. The protective layer covers the reflective electrode and a portion of the second micro light emitting device. The first conductive electrode covers the protective layer and is electrically connected to the second micro light emitting device.

20 Claims, 22 Drawing Sheets

(51) Int. Cl.
*H01L 25/075* (2006.01)
*H01L 27/12* (2006.01)
*H01L 33/52* (2010.01)
*H01L 33/58* (2010.01)
*G02B 26/00* (2006.01)
*G02F 1/1333* (2006.01)
*G02F 1/1343* (2006.01)
*G02F 1/1368* (2006.01)
*G02F 1/1523* (2019.01)
*H01L 33/60* (2010.01)
*H01L 33/62* (2010.01)
*H01L 33/42* (2010.01)

(52) U.S. Cl.
CPC .............. *H01L 33/52* (2013.01); *H01L 33/58* (2013.01); *H01L 51/5271* (2013.01); *G02B 26/005* (2013.01); *G02F 1/1368* (2013.01); *G02F 1/13439* (2013.01); *G02F 1/133345* (2013.01); *G02F 1/1523* (2013.01); *G02F 2001/133342* (2013.01); *H01L 33/42* (2013.01); *H01L 33/60* (2013.01); *H01L 33/62* (2013.01); *H01L 2933/005* (2013.01); *H01L 2933/0058* (2013.01); *H01L 2933/0066* (2013.01)

(58) Field of Classification Search
CPC ......... H01L 2251/5323; H01L 51/5262; H01L 51/5271; H01L 51/00–56; H01L 33/44–465; H01L 33/00–648; G09G 2300/08
See application file for complete search history.

(56) References Cited

U.S. PATENT DOCUMENTS

2015/0076456 A1* 3/2015 Choi ................... H01L 27/3267
257/40
2016/0181332 A1* 6/2016 Park ................... H01L 27/3246
257/88

* cited by examiner

US 10,403,612 B2

DUAL-SIDED DISPLAY AND METHOD FOR FABRICATING THE SAME

BACKGROUND

Technical Field

The present disclosure relates to dual-sided displaying technologies for a display, and in particular, to a dual-sided display and a method for fabricating the same.

Related Art

Generally, a dual-sided display allows a viewer to separately view different displayed images from two opposite sides of the dual-sided display. For example, for a mobile phone on which a dual-sided display is mounted, a main function window may be displayed on one side of the dual-sided display, and content of an application program (mobile application) may be displayed on the other side of the dual-sided display. In addition, an image may be displayed on one side of the dual-sided display, and the other side of the dual-sided display may be used only for lighting. For example, for a display case on which a dual-side transparent display is mounted, an image may be displayed on one side (facing the outer side of the display case) of the dual-side transparent display as advertisement content or a product introduction, and the other side (facing the inner side of the display case) of the dual-side transparent display may illuminate a commodity inside the display case, so that a viewer can clearly see both an introduction picture of the commodity through the dual-side transparent display and the commodity that is inside the display case from the outer side of the display case.

Therefore, how to improve a light and thin design of the dual-sided display or to enable a image on only one side of a dual-sided display to be viewed as an accurate image (not a mirror image) by a viewer, in other words, resolving the mirror image (or called opposite image) generated by the dual-sided display.

SUMMARY

The present disclosure provides a dual-sided display and a method for fabricating the dual-sided display. A sub-pixel of the dual-sided display has at least two micro light emitting devices, and two micro light emitting devices thereof emit light in opposite directions and may be separately controlled to achieve a dual-sided displaying effect.

An embodiment of the present disclosure provides a dual-sided display. The dual-sided display includes multiple sub-pixels, a first active device, a first micro light emitting device, a patterned photoresist layer, a reflective electrode, a second micro light emitting device, a protective layer, and a first conductive electrode. The first active device is disposed on a substrate. The first micro light emitting device is located on the substrate, and the first micro light emitting device includes at least a first electrode, a second electrode, and a first light emitting layer that is disposed between a first electrode and a second electrode. The second electrode of the first micro light emitting device is electrically connected to the first active device. The patterned photoresist layer is disposed on the substrate and covers a portion of the first micro light emitting device. The patterned photoresist layer has a first opening and a second opening, and a projection of the first opening in a vertical projection direction partially overlaps a projection of the first micro light emitting device. The reflective electrode is disposed on the substrate and covers the first micro light emitting device, the patterned photoresist layer, and the substrate that is exposed at the second opening. The reflective electrode is electrically connected to the first electrode of the first micro light emitting device through the first opening. The second micro light emitting device is disposed on the reflective electrode of the second opening. The second micro light emitting device includes at least a third electrode, a fourth electrode, and a second light emitting layer that is disposed between the third electrode and the fourth electrode. The protective layer is disposed on the substrate, and covers the reflective electrode and a portion of the second micro light emitting device. The protective layer has a third opening, and in the vertical projection direction, a projection of the third opening partially overlaps a projection of the second micro light emitting device. The first conductive electrode is disposed on the protective layer, and covers the protective layer, where the first conductive electrode is electrically connected to the fourth electrode of the second micro light emitting device through the third opening.

An embodiment of the present disclosure provides a method for fabricating a dual-sided display. The method includes: forming a first active device in a light emitting area of a substrate; disposing a first micro light emitting device on the light emitting area of the substrate; forming a photoresist layer on the substrate that covers the first micro light emitting device; patterning the photoresist layer to form a patterned photoresist layer; covering a reflective electrode on the patterned photoresist layer and the substrate; disposing a second micro light emitting device on the reflective electrode inside the second opening; forming a protective layer covering the reflective electrode and a portion of the second micro light emitting device; and forming a first conductive electrode on the protective layer. In this way, the first micro light emitting device is electrically connected to the first active device. In this way, the patterned photoresist layer has a first opening and a second opening, the reflective electrode is coupled to the first micro light emitting device through the first opening, and the reflective electrode covers the substrate that is exposed at the second opening. In this way, the second micro light emitting device is disposed on the reflective electrode inside the second opening. In this way, the protective layer has a third opening, and the first conductive electrode is electrically connected to the second micro light emitting device through the third opening.

DETAILED DESCRIPTION

Figure 1:
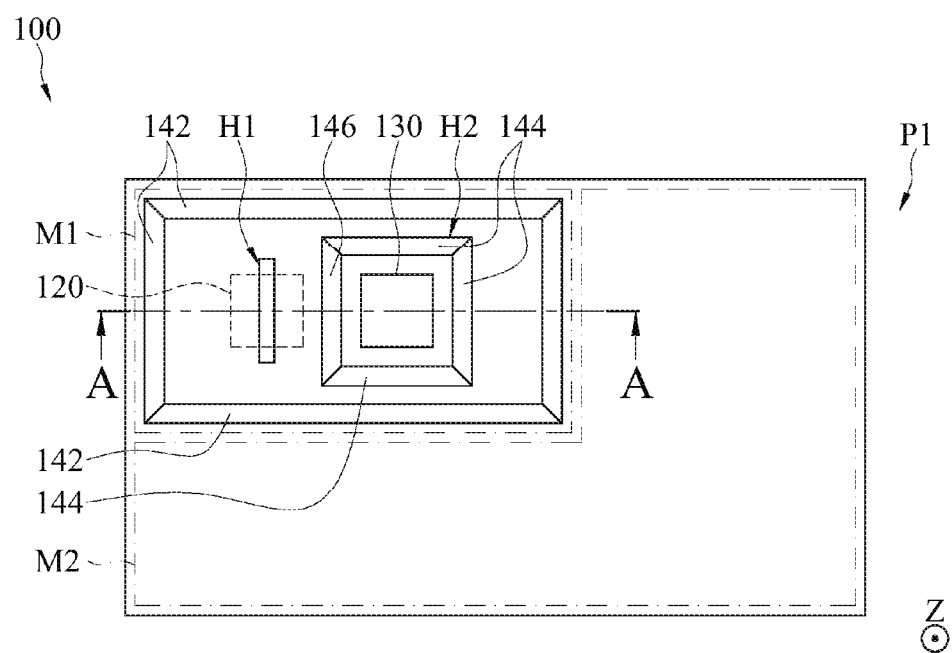
FIG. 1 is a schematic top view of a structure of a dual-sided display according to an embodiment of the present disclosure.

The present disclosure is described more comprehensively below with reference to the accompanying drawings, and exemplary embodiments of the present disclosure are shown in the accompanying drawings. A person skilled in the art may learn that, the described embodiments may be modified in various manners, and the embodiments may be combined with each other, without departing from the spirit or the scope of the present disclosure.

It will be understood that when an element such as a layer, film, region, or substrate is referred to as being "on" or "connected to" another element, it can be directly on or connected to the other element or intervening elements may also be present. In contrast, when an element is referred to as being "directly on" or "directly connected to" another element, there are no intervening elements present. As used herein, "connected" may refer to a physical and/or electrical connection. Furthermore, "electrically connected" or "coupled" may be other elements between two elements.

It should be understood that, although terms such as "first", "second", and "third" herein may be used to describe various devices, parts, areas, layers, and/or portions, these devices, parts, areas, layers, and/or portions should not be limited by these terms. These terms are merely used for distinguishing one device, part, area, layer, or portion from another device, part, area, layer, or portion. Therefore, "a first device", "part", "area", "layer", or "portion" described below may be referred to as a second device, part, area, layer, or portion, without departing from the teachings herein.

The terms used herein are merely for describing a particular embodiment, but not for limitation. As used herein, unless otherwise noted in the content, "a", "an", and "the" in a singular form are intended to include a plural form, also including "at least one". "Or" represents "and/or". As used herein, the term "and/or" includes any or all combinations of one or more related listed items. It should be further understood that, when being used in this specification, the term "include" and/or "include" specifies existence of the features, areas, entireties, steps, operations, device, and/or parts, but does not exclude existence or addition of one or more other features, areas, entireties, steps, operations, devices, parts, and/or a combination thereof.

In addition, relative terms such as "lower" or "bottom" and "upper" or "top" may be used herein to describe a relationship between an element and another element, as shown in the figures. It should be understood that, the relative terms are intended to include different orientation of apparatuses in addition to the orientations shown in the figures. For example, if an apparatus in a figure is reversed, a element described as being on a "lower" side of another element is orientated on an "upper" side of the another element. Therefore, the exemplary term "lower" may include orientations of "upper" and "lower", and this depends on a particular orientation of the accompanying drawing. Similarly, if an apparatus in a figure is reversed, an element described as being "below" another element or a element "below" is orientated "above" the another element. Therefore, the exemplary term "under" or "under" may include orientations of being above and below.

"About" or "approximately" or "substantially" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used here have same meanings that are generally understood by a person of ordinary skill in the art of the present disclosure. It is further understood that, terms defined in dictionaries that are usually used should be construed as having meanings that are the same as meanings of the terms in the related art and the context of the present disclosure, and are not construed as having ideal or excessively formal meanings, unless this is explicitly defined herein.

An exemplary embodiment is described herein with reference to a sectional view that is used as a schematic diagram of an ideal embodiment. Therefore, a shape change that is shown in a figure and that is used as a result of, for example, a manufacturing technology and/or a tolerance can be expected. Therefore, the embodiment described herein should not be construed as being limited to a particular shape of an area shown herein, but includes, for example, a shape deviation caused by manufacturing. For example, an area that is shown or described as being flat may usually have rough and/or non-linear features. In addition, a shown acute angle may be round. Therefore, areas shown in a figure are essentially schematic, and shapes of the areas are not intended to show accurate shapes of the areas, and are not intended to limit the scope of the claims.

Figure 2:
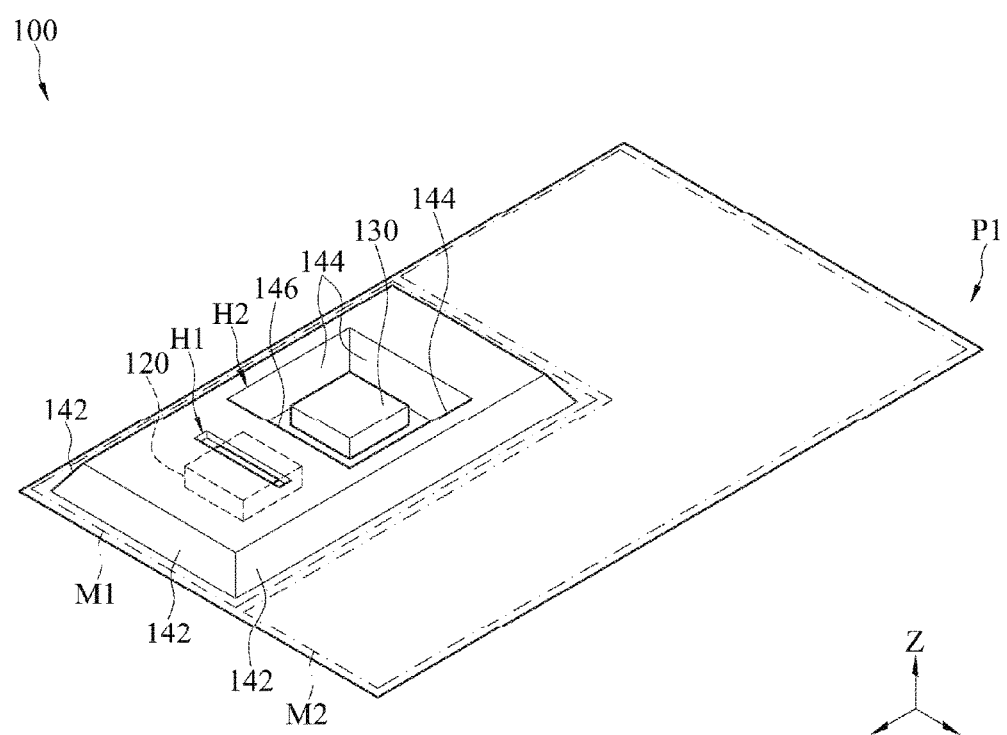
FIG. 2 is a schematic three-dimensional overview diagram of the structure of the dual-sided display corresponding to FIG. 1.
Figure 3:
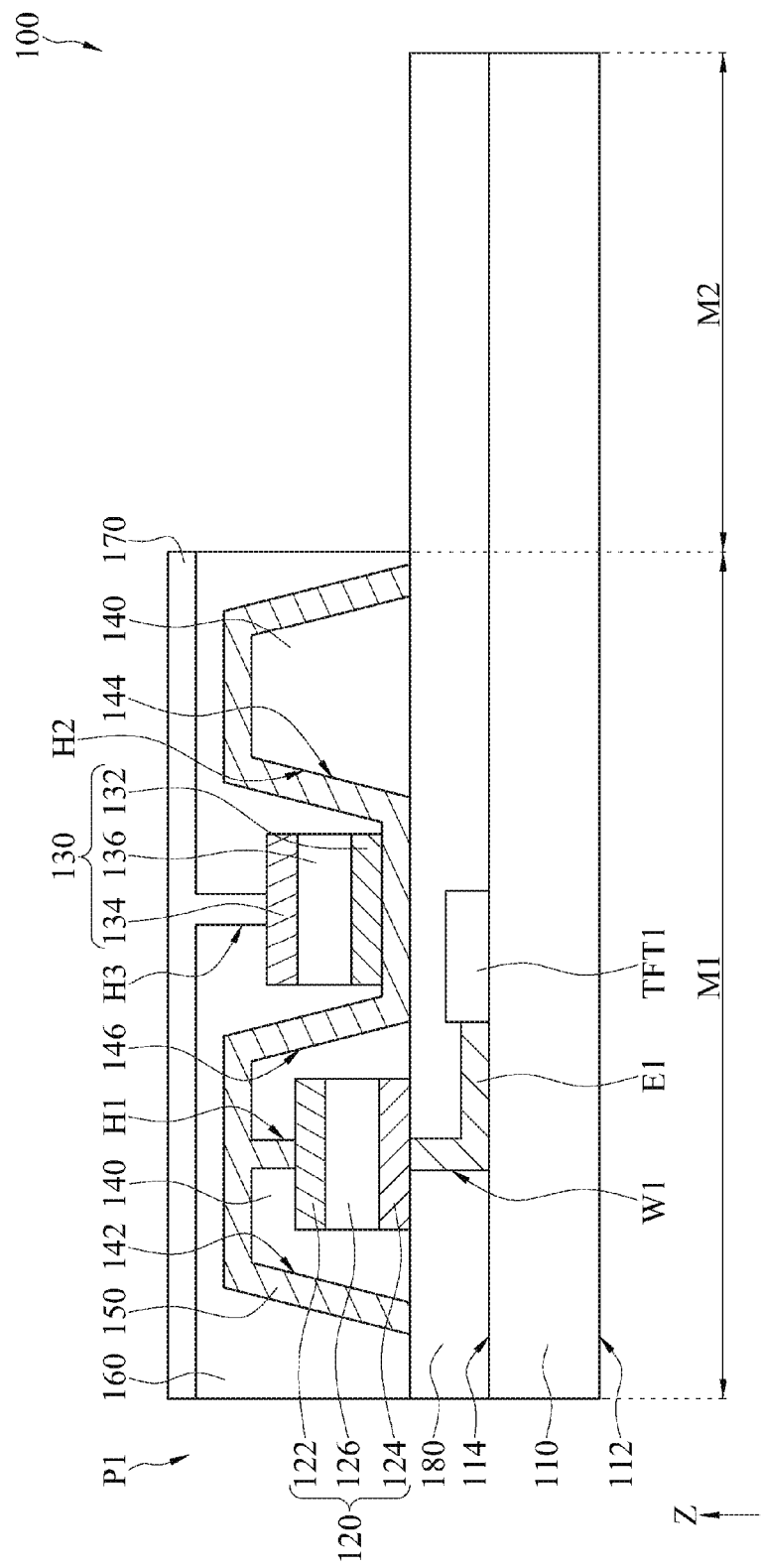
FIG. 3 is a schematic sectional view of a dual-sided display corresponding to line A-A in FIG. 1.

FIG. 1 is a schematic top view of a structure of a dual-sided display according to an embodiment of the present disclosure. FIG. 2 is a schematic three-dimensional overview diagram of the structure of the dual-sided display corresponding to FIG. 1. FIG. 3 is a schematic sectional view of a dual-sided display corresponding to line A-A in FIG. 1. Referring to FIG. 1, FIG. 2, and FIG. 3, the dual-sided display 100 has multiple sub-pixels P1, and the sub-pixels P1 are disposed in an array (FIG. 1 does not show the array disposition, and the array disposition is shown in subsequent figures). For convenience of description, one of the sub-pixels P1 is shown in FIG. 1, FIG. 2, and FIG. 3 for schematic description.

Each sub-pixel P1 is disposed on a substrate 110 and each sub-pixel P1 includes at least two micro light emitting devices (such as a first micro light emitting device 120 and a second micro light emitting device 130), a patterned photoresist layer 140, a reflective electrode 150, a protective layer 160, a conductive electrode (or referred to as a first conductive electrode 170), and an active device (such as a first active device TFT1). The first micro light emitting device 120 is located on the substrate 110. The patterned photoresist layer 140 is disposed on the substrate 110 and covers a portion of the first micro light emitting device 120. The reflective electrode 150 covers the patterned photoresist layer 140. The reflective electrode 150 penetrates through the patterned photoresist layer 140 and is electrically connected to the first micro light emitting device 120. The second micro light emitting device 130 is located on the reflective electrode 150, and the second micro light emitting device 130 is electrically connected to the reflective electrode 150. The protective layer 160 covers the reflective electrode 150 and a portion of the second micro light emitting device 130. The first conductive electrode 170 penetrates through the protective layer 160 and is electrically connected to the second micro light emitting device 130. For example, one electrode (such as a third electrode 132) of the second micro light emitting device 130 is connected to one electrode (such as a first electrode 122) of the first micro light emitting device 120 by using the reflective electrode 150. Another electrode (such as a second electrode 124) of the first micro light emitting device 120 is electrically connected to the first active device TFT1. Another electrode (such as a fourth electrode 134) of the second micro light emitting device 130 is connected to the first conductive electrode 170.

In some embodiments, the substrate 110 is preferably a transparent substrate, but this is not used to limit the present disclosure. In some embodiments, for example, the substrate 110 is a glass substrate or a sapphire substrate, but the present disclosure is not limited thereto.

In some embodiments, at least one of the first micro light emitting device 120 or the second micro light emitting device 130 may be an organic light emitting diode or an inorganic light emitting diode (micro-led), and a size of the micro light emitting device is less than 50 micrometers, but is not limited thereto.

In an embodiment, the first micro light emitting device 120 includes at least two electrodes (such as the first electrode 122 and the second electrode 124) and a light emitting layer (such as a first light emitting layer 126). The first light emitting layer 126 is disposed between the first electrode 122 and the second electrode 124. Generally, multiple semiconductor layers (not shown in the figure) are sandwiched between two electrodes. For example, in a P-N junction manner, there is a first-type semiconductor layer (not shown in the figure) and a second-type semiconductor layer whose polarity is opposite to that of the first-type semiconductor layer (not shown in the figure); or in a P-I-N junction manner, there is a first-type semiconductor layer, a second-type semiconductor layer whose polarity is opposite to that of the first-type semiconductor layer, and a quantum well layer (or an intrinsic layer, which is not shown in the figure) located between the first-type semiconductor layer and the second-type semiconductor layer. The polarity of the first-type semiconductor layer and the polarity of the second-type semiconductor layer may be respectively N-type or P-type semiconductor layer. In some embodiments, a light emitting location of the first micro light emitting device 120 may be on an interface of two semiconductor layers whose polarities are opposite to each other, between two semiconductor layers whose polarities are opposite to each other, or on at least one layer of multiple semiconductor layers, and then the light emitting layer may be an interface of two semiconductor layers whose polarities are opposite to each other, between two semiconductor layers whose polarities are opposite to each other, or at least one layer of multiple semiconductor layers. In some embodiments, the first-type semiconductor layer (not shown in the figure) may be either of a p-type semiconductor layer mixed with a third group of elements and an n-type semiconductor layer mixed with a fifth group of elements, and the second-type semiconductor layer (not shown in the figure) may be the other one of the p-type semiconductor layer mixed with the third group of elements and the n-type semiconductor layer mixed with the fifth group of elements. In an embodiment, the first micro light emitting device 120 may be a vertical diode structure. For example, the first electrode 122 and the second electrode 124 are located on two opposite sides of the first light emitting layer 126, as shown in FIG. 3. In another embodiment, the first micro light emitting device 120 may alternatively be a horizontal diode structure. For example, the first electrode 122 and the second electrode 124 are located on a same side of the first light emitting layer 126. A category of the first micro light emitting device 120 is not limited in the present disclosure, and the category may be selected according to an electrical connection design or a process requirement.

In an embodiment, at least one of the first electrode 122 or the second electrode 124 may be a transparent electrode or a non-transparent electrode. The material of at least one of the first electrode 122 or the second electrode 124 may be metal, alloy, a transparent conductive material, or another proper material, or a stack layer of at least two of the foregoing materials. However, the present disclosure is not limited thereto.

In some embodiments, the dual-sided display 100 may further include an insulation layer 180. The insulation layer 180 covers the first active device TFT1 and the substrate 110, and the patterned photoresist layer 140 is disposed on the insulation layer 180. The insulation layer 180 has a contact hole (or referred to as a first contact hole W1), and the first active device TFT1 is electrically connected to either of the first electrode 122 and the second electrode 124 of the first micro light emitting device 120 through the first contact hole W1. For example, the first active device TFT1 may be electrically connected to the second electrode 124 of the first micro light emitting device 120 by using a connecting electrode (or referred to as a first connecting electrode El), but not limited its.

In some embodiments, the first active device TFT1 may be but is not limited to a bottom-gate-type thin film transistor or a top-gate-type thin film transistor. In some embodiments, preferably, in a vertical projection direction Z orientated towards the substrate 110, a projection of the first active device TFT1 does not overlap a projection of the first micro light emitting device 120, so that light emitted by the first micro light emitting device 120 is relatively not blocked by the first active device TFT1 when the light is emergent towards the substrate 110, but not limited its. In some embodiments, in the vertical projection direction Z orientated towards the substrate 110, the projection of the first active device TFT1 may partially overlap the projection of the first micro light emitting device 120, but an overlapping area of the two projections is less than about 50%.

The patterned photoresist layer 140 covers a portion of the substrate 110 and a portion of the first micro light emitting device 120. The patterned photoresist layer 140 has a first opening H1 and a second opening H2. In the vertical projection direction Z orientated towards the substrate 110, a projection of the first opening H1 at least partially overlaps a projection of the first micro light emitting device 120. That is, the first opening H1 corresponds to the first micro light emitting device 120, and exposes a portion of an upper surface of the first micro light emitting device 120. In some embodiments, the first opening H1 at least does not cover a portion of an upper surface of the first electrode 122 of the first micro light emitting device 120. The second opening H2 is adjacent to the first opening H1, penetrates through the patterned photoresist layer 140, and exposes a portion of the substrate 110. In the vertical projection direction Z orientated towards the substrate 110, the projection of the second opening H2 does not overlap the projection of the first micro light emitting device 120. That is, the second opening H2 does not correspond to the first micro light emitting device 120, and does not expose the first micro light emitting device 120. In addition, to explicitly display the appearance of the patterned photoresist layer 140, devices (such as the reflective electrode 150, the protective layer 160, and the first conductive electrode 170) that cover the patterned photoresist layer 140 are not shown in FIG. 1 and FIG. 2.

In an embodiment, a material of the patterned photoresist layer 140 is preferably a transparent photoresist material. However, the present disclosure is not limited thereto. In some other embodiments, the material of the patterned photoresist layer 140 may be a colored material, for example, a black matrix material, a multi-color stack material, or another proper material.

The reflective electrode 150 covers an outer surface of the patterned photoresist layer 140. The reflective electrode 150 runs through the patterned photoresist layer 140 through the first opening H1, to contact the first electrode 122 of the first micro light emitting device 120, and the reflective electrode 150 is electrically connected to the first electrode 122. In addition, the reflective electrode 150 is directly contacted a surface of the substrate 110 that is exposed at the bottom of the second opening H2 through the second opening H2, that is, the reflective electrode 150 penetrates through the patterned photoresist layer 140 through the second opening H2, to directly cover the surface of the substrate 110. In an embodiment, the reflective electrode 150 covers the outer surface of the patterned photoresist layer 140. That is, the reflective electrode 150 is attached to the outer surface of the patterned photoresist layer 140 and extends along the outer surface of the patterned photoresist layer 140, so that a shape of the reflective electrode 150 is substantial conformably with a surface shape of the patterned photoresist layer 140.

In an embodiment, the reflective electrode 150 preferably has electric conductivity and light reflection quality. A material of the reflective electrode 150 may be in a single-layer structure or a multi-layer structure, and may be but is not limited to metal, alloy, or another proper material. In some embodiments, in the multi-layer structure of the reflective electrode 150, one layer may be metal, alloy, or a salt material of the foregoing materials, or a transparent conductive material, or another proper material.

The second micro light emitting device 130 is disposed on the reflective electrode 150 in the second opening H2 of the patterned photoresist layer 140. For example, the second opening H2 may be regarded as a holding slot used to accommodate the second micro light emitting device 130. The first micro light emitting device 120 is sandwiched between the patterned photoresist layer 140 and the substrate 110, and the second micro light emitting device 130 is disposed on a surface of the reflective electrode 150 between the patterned photoresist layer 140 and the surface of the reflective electrode 150 is away from the substrate 110.

The second micro light emitting device 130 includes at least two electrodes (such as the third electrode 132 and the fourth electrode 134) and a light emitting layer (such as a second light emitting layer 136). The second light emitting layer 136 is disposed between the third electrode 132 and the fourth electrode 134. In some embodiments, the reflective electrode 150 is directly contact an electrode (such as the third electrode 132) of the second micro light emitting device 130, to be electrically connected to the second micro light emitting device 130.

In an embodiment, the second micro light emitting device 130 may be a vertical diode structure type. For example, the third electrode 132 and the fourth electrode 134 are located on two opposite sides of the second light emitting layer 136, as shown in FIG. 3. In some other embodiments, the second micro light emitting device 130 may alternatively be a horizontal diode structure type. For example, the third electrode 132 and the fourth electrode 134 are located on the same side of the second light emitting layer 136. A type of the second micro light emitting device 130 is not limited in the present disclosure, and the type may be selected according to an electrical connection design or a process requirement. In some embodiments, the second micro light emitting device 130 and the first micro light emitting device 120 may essentially belong to substantially the same type, for example, both are in the vertical diode structure type, as shown in FIG. 3. However, the present disclosure is not limited thereto. In some embodiments, the second micro light emitting device 130 and the first micro light emitting device 120 may belong to different types of structures.

In an embodiment, a structure and/or material of either of the third electrode 132 and the fourth electrode 134 refer to a structure and/or material of either of the first electrode 122 and the second electrode 124. Details are not described herein again. In some embodiments, the structure and/or material of either of the third electrode 132 and the fourth electrode 134 may be selectively and essentially the same as or different from the structure and/or material of either of the first electrode 122 and the second electrode 124. A description, pattern, and/or material of the second light emitting layer 136 refer to the first light emitting layer 126. Details are not described herein again. In some embodiments, the pattern and/or material of the first light emitting layer 126 may be selectively and essentially the same as or different from a pattern and/or material of the second light emitting layer 136.

The protective layer 160 is disposed on the substrate 110, and covers the reflective electrode 150 and the second micro light emitting device 130. The protective layer 160 has a third opening H3. In the vertical projection direction Z orientated towards the substrate 110, a projection scope of the third opening H3 partially overlaps a projection scope of the second micro light emitting device 130. That is, the protective layer 160 has the third opening H3, corresponding to the second micro light emitting device 130, and exposing a portion of an upper surface of the second micro light emitting device 130. In an embodiment, the third opening H3 exposes at least a portion of an electrode (such as the fourth electrode 134) of the second micro light emitting device 130, and it may be regarded that the fourth electrode 134 of the second micro light emitting device 130 is located at the bottom of the third opening H3.

In some embodiments, the protective layer 160 may be in a single-layer structure or a multi-layer structure, and a material of the protective layer 160 may be an inorganic material (such as silicon nitride (SiNx), silicon oxide (SiOx), silicon oxynitride (SiON), or other proper material), an organic material (such as a photoresist, polyester, or polyimide material, or other proper material), or other proper material.

The first conductive electrode 170 is disposed on the protective layer 160, and the first conductive electrode 170 covers the protective layer 160. The first conductive electrode 170 is electrically connected to an electrode (such as the fourth electrode 134) of the second micro light emitting device 130 through the third opening H3 of the protective layer 160.

In some embodiments, a material of the first conductive electrode 170 may be a transparent conductive material (such as indium tin oxide, indium zinc oxide, aluminium tin oxide, aluminium zinc oxide, indium germanium zinc oxide, or other proper oxide, or a stack layer of at least two of the foregoing; or a nano carbon pipe/bar, an organic conductive material, or a reflective material whose thickness is less than about 60 Angstrom, or other proper oxide, or a combination of at least two of the foregoing materials). The first conductive electrode 170 may also include a reflective conductive material (for example, a material that is the same as that of the reflective electrode 150 may be used) or a semi-transparent and semi-reflective conductive material (for example, a portion of the first conductive electrode 170 is made from the transparent conductive material and the reflective conductive material).

Figure 7:
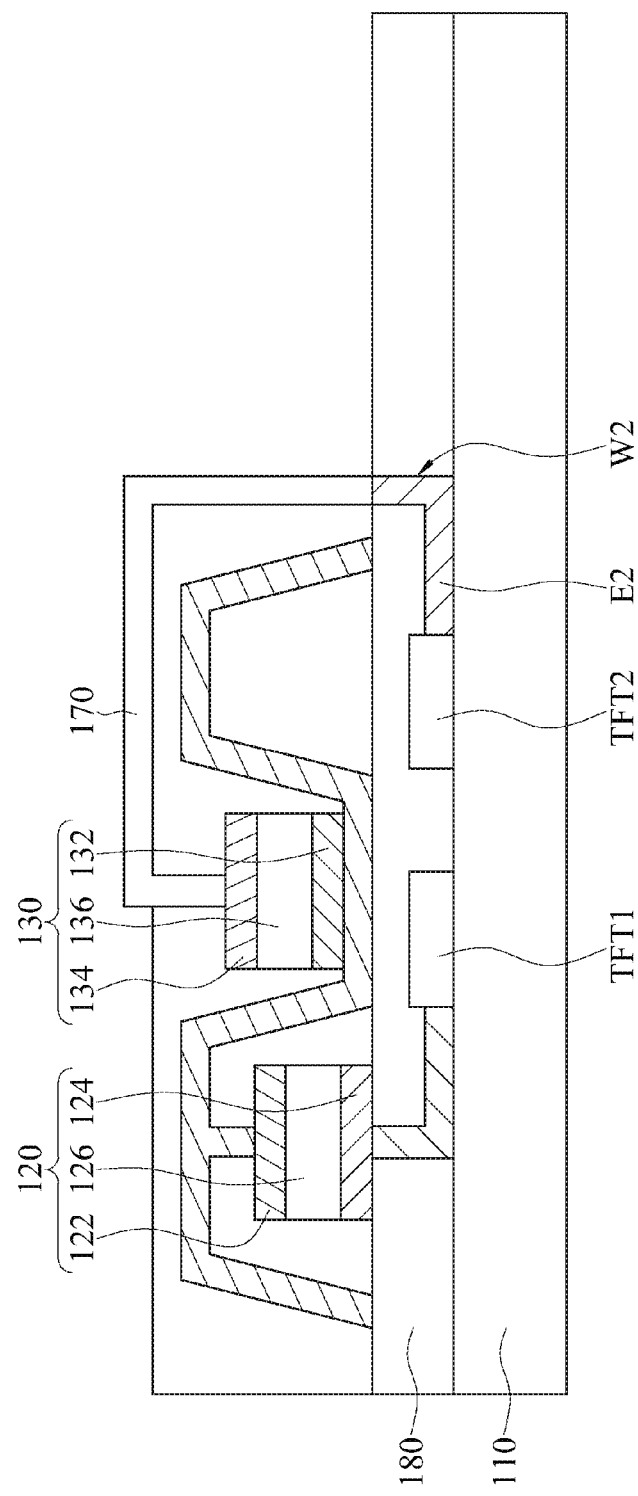
FIG. 7 is a schematic structural diagram of a cross section of a dual-sided display according to another embodiment of the present disclosure.

In an embodiment, as shown in FIG. 3, the first conductive electrode 170 may cover an entire upper surface of the protective layer 160, and a material of the first conductive electrode 170 may be transparent, substantially transparent, or other proper material. Or, the first conductive electrode 170 may cover an entire upper surface of the protective layer 160, a material of the first conductive electrode 170 on a portion of an upper surface of the protective layer 160 may be transparent, substantially transparent, or other proper material, and a material of the first conductive electrode 170 on another portion of the upper surface of the protective layer 160 may be a non-transparent material (or referred to as a reflective material). In some other embodiments, the first conductive electrode 170 may cover only an upper surface of a portion of the protective layer 160, and a material of the first conductive electrode 170 may be transparent, substantially transparent, or another proper material, as shown in FIG. 7. Alternatively, the first conductive electrode 170 may cover only an upper surface of a portion of the protective layer 160, a material of the first conductive electrode 170 may be a non-transparent material (or referred to as a reflective material), the non-transparent material covers only a portion of the second micro light emitting device 130, and a transparent material may be selectively disposed for or a conductive material (such as the first conductive electrode 170) may not be disposed for the other area that is of the second micro light emitting device 130 and that is not covered by the non-transparent material.

In some embodiments, the patterned photoresist layer 140 that covers the first micro light emitting device 120 tapers in a direction orientated away from the substrate 110 (for example, the first micro light emitting device 120 is narrow on the top and wide on the bottom in the sectional view). A holding slot (such as the second opening H2) in which the second micro light emitting device 130 is disposed is divergent in a direction orientated away from the substrate 110 (for example, the second micro light emitting device 130 is wide on the top and narrow on the bottom in the sectional view).

In some embodiments, the patterned photoresist layer 140 has multiple side surfaces, as shown in FIG. 1, FIG. 2, and FIG. 3. These side surfaces include at least one first side surface 142, at least one second side surface 144, and at least one shared side surface 146. In some embodiments, the first side surface 142 and the shared side surface 146 are located around the first micro light emitting device 120, and tilt in a direction orientated towards the first micro light emitting device 120. The second side surface 144 and the shared side surface 146 are located around the second micro light emitting device 130, and tilt away from the second micro light emitting device 130. In another embodiment, the first side surface 142 is located around at least a portion of the first micro light emitting device 120 and around at least a portion of the second micro light emitting device 130, the shared side surface 146 is located between the first micro light emitting device 120 and the second micro light emitting device 130, and the second side surface 144 is located around a portion of the second micro light emitting device 130. The second side surface 144 is located in a range surrounded by the first side surface 142. That is, the second side surface 144 and the shared side surface 146 may be regarded as a wall of hole of the second opening H2, and a diameter of the second opening H2 decreases in a direction orientated towards the substrate 110. The shared side surface 146 is located between the first micro light emitting device 120 and the second micro light emitting device 130, and tilt in a direction orientated towards the first micro light emitting device 120.

Figure 5A:
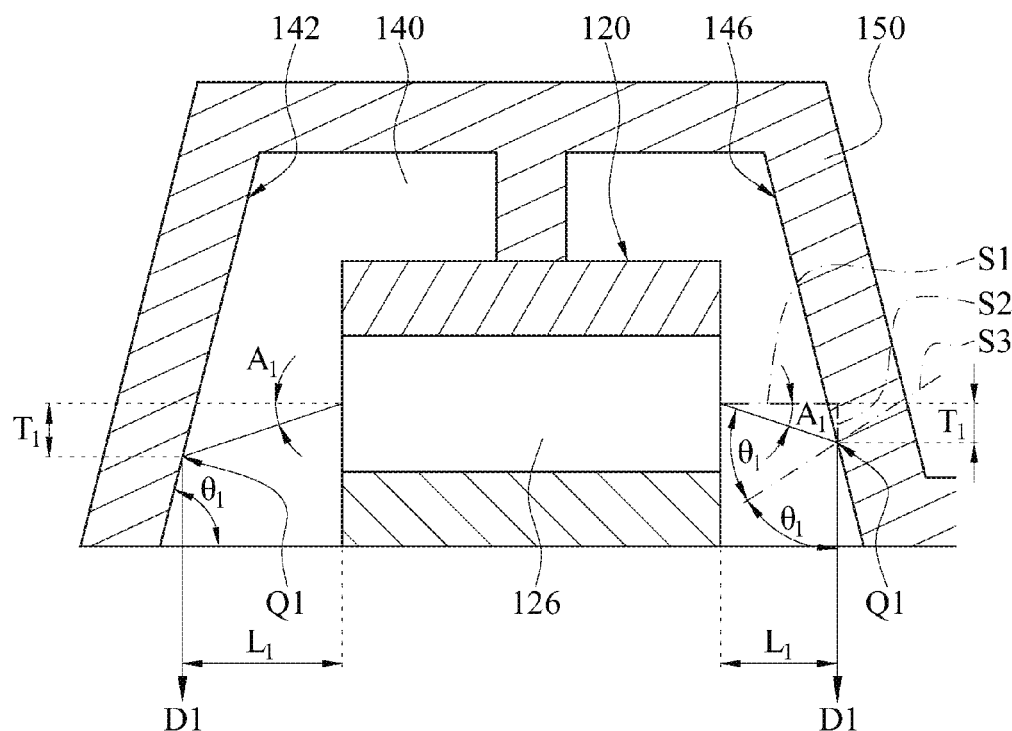
FIG. 5A is a schematic structural diagram of a local section of a dual-sided display corresponding to a first micro light emitting device in FIG. 3.
Figure 5B:
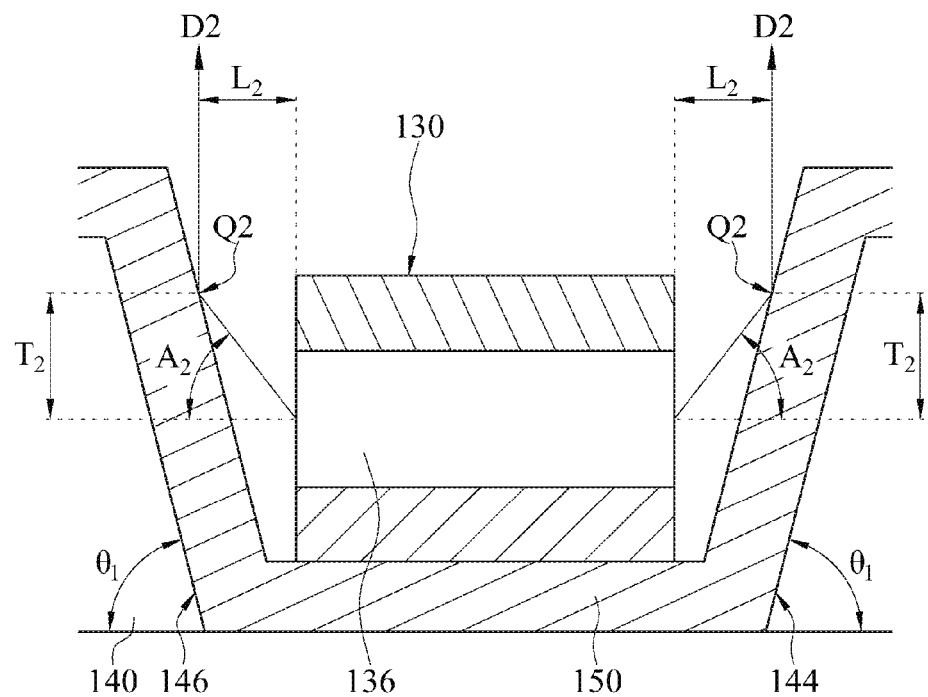
FIG. 5B is a schematic structural diagram of a local section of a dual-sided display corresponding to a second micro light emitting device in FIG. 3.

Referring to FIG. 5A and FIG. 5B, for convenience of description, FIG. 5A and FIG. 5B are respectively local schematic structural diagrams of the first micro light emitting device 120 and the second micro light emitting device 130 in FIG. 3. In an embodiment, there is respectively an acute angle $\theta_1$ between each side surface (the first side surface 142, the second side surface 144, or the shared side surface 146) and the upper surface of the substrate 110. The acute angle $\theta_1$ may be approximately between about 40° and about 70°.

Figure 4:
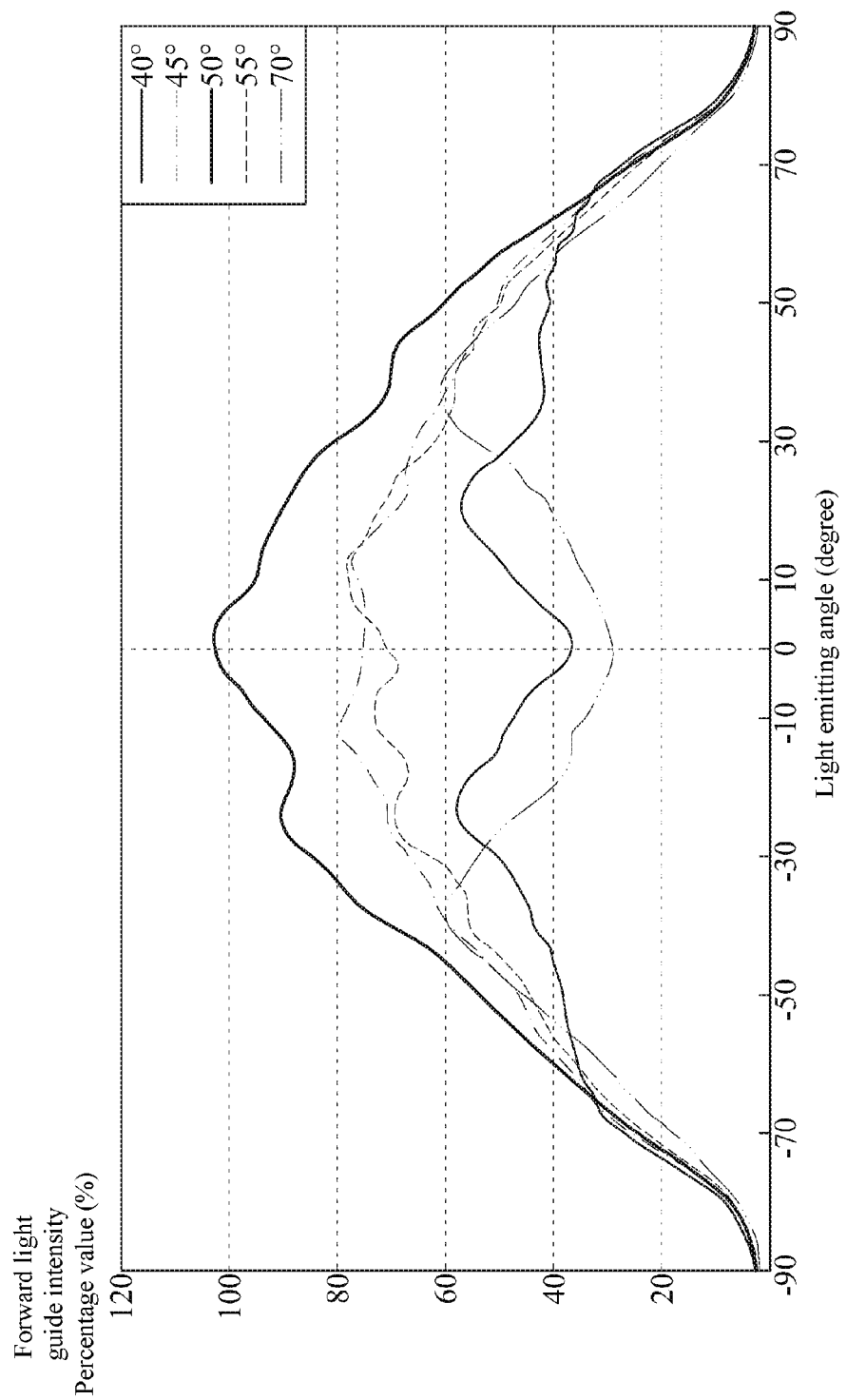
FIG. 4 is a curve diagram of forward light guide intensity corresponding to a patterned photoresist layer that has a different acute angle.

Referring to FIG. 5A and FIG. 5B, by means of properly adjusting the acute angle $\theta_1$ between the first side surface 142, the second side surface 144, or the shared side surface 146 and the upper surface of the substrate 110, vertical light emitting ratios of the first micro light emitting device 120 and the second micro light emitting device 130. For example, by means of properly adjusting the acute angle $\theta_1$, light emitting probabilities of first light D1 (which is roughly vertical and emitted in a direction orientated towards the inner surface of the substrate 110) of the first micro light emitting device 120 and second light D2 (which is roughly vertical and emitted in a direction orientated away from the inner surface of the substrate 110) of the second micro light emitting device 130 are increased. That is, a probability that the first light D1 and the second light D2 are forward guided is increased, so as to present a relatively good light guide effect. FIG. 4 is a curve diagram of forward light guide intensity corresponding to a patterned photoresist layer that has a different acute angle. In the curve diagram, the forward light guide intensity varies with a light emitting angle. Table 1 shows data related to the forward light guide intensity and the acute angle $\theta_1$. The X-axis in FIG. 4 is the light emitting angle, and the Y-axis in FIG. 4 is a percentage value of light emitting intensity.

TABLE 1

|  | Acute angle $\theta_1$ | | | | |
| --- | --- | --- | --- | --- | --- |
|  | 40° | 45° | 50° | 55° | 70° |
| Percentage value of forward light guide intensity | 35.2% | 73.4% | 100% | 69.1% | 28.1% |

That, the light emitting angle refers to an included angle respectively between emitted light and a normal line of the substrate 110. When the light emitting angle is approximately 0°, it indicates that light is emitted perpendicular to an inner surface of the substrate 110. For example, an included angle between the first light D1 (or the second light D2) and the normal line of the substrate 110 is approximately 0°. In addition, a positive symbol (+) and a negative symbol (−) of the light emitting angle are used to distinguish directionality that emitted light deviates from the normal line of the substrate 110. Herein, it can be known from FIG. 4 and Table 1 that, in some embodiments, when the acute angle $\theta_1$ is approximately 50°, preferred forward light guide intensity of the first light D1 and/or the second light D2 may be obtained, light collimation of the first micro light emitting device 120 and the second micro light emitting device 130 may be relatively high.

In some embodiments, as shown in FIG. 5A and FIG. 5B, when the first light D1 emitted by the first light emitting layer 126 of the first micro light emitting device 120 and the second light D2 emitted by the second light emitting layer 136 of the second micro light emitting device 130 are respectively incident upon the reflective electrode 150 that is attached to the first side surface 142, the second side surface 144, or the shared side surface 146, the first light D1 and the second light D2 may be respectively reflected to the two opposite sides of the dual-sided display 100. That is, the first light D1 and the second light D2 may be respectively emergent towards the two opposite sides (such as a first side 112 and a second side 114) of the substrate 110 by means of being incident upon the reflective electrode 150 that is attached to the first side surface 142, the second side surface 144, or the shared side surface 146.

In addition, a probability that the first light D1 and the second light D2 are forward guided may be increased by properly adjusting locations at which the first micro light emitting device 120 and the second micro light emitting device 130 are disposed, so as to present a relatively good light guide effect.

Auxiliary lines S1 and S2 and an auxiliary normal line S3 are marked in FIG. 5A, an included angle between the auxiliary line S1 and the auxiliary line S2 is 90°, and the auxiliary normal line S3 is a normal line of the shared side surface 146. The first micro light emitting device 120 is tangent to a bottom surface of the patterned photoresist layer 140. Therefore, light emitting of forward light guide cannot be ensured, or it may be regarded that light collimation of the first micro light emitting device 120 is not good. Therefore, for the first micro light emitting device 120, as shown in FIG. 5A, the first light emitting layer 126 emits one light (such as the first light D1) thereof to a side surface (such as the first side surface 142 or the shared side surface 146), and the first light D1 is reflected by the reflection point Q1 to the substrate 110. There is a shortest distance T1 (such as a length of the auxiliary line S2) between a horizontally extended surface of a light emitting surface of the first light emitting layer 126 and the reflection point Q1. There is a shortest distance $L_1$ (such as a length of the auxiliary line S1) between the first micro light emitting device 120 and the reflection point Q1. There is an included angle $A_1$ between the first light D1 and the horizontally extended surface of the light emitting surface of the first light emitting layer 126. When an angle between light (such as the first light D1) emitted by the first micro light emitting device 120 and a side surface (such as the first side surface 142 or the shared side surface 146) is the acute angle $\theta_1$, it may be learned by using the auxiliary lines S1 and S2 and the auxiliary normal line S3 (such as a normal line of the shared side surface 146) that, the included angle $A_1$ is approximately equal to a difference between twice the acute angle $\theta_1$ and the right angle (90°) (for example, the included angle) $A_1=2\theta_1-90°$. When structure design of the first micro light emitting device 120 and the patterned photoresist layer 140 satisfies the following formula (1), it can be ensured that a light guide effect of the first light D1 is achieved (for example, the reflected first light D1 is substantially perpendicular to an upper surface (or an inner surface) of the substrate 110):

$$T_1 > L_1 \tan(A_1) (1) \text{ or}$$

$$T_1 > L_1 \tan(2\theta_1-90°) \qquad (1)$$

Based on this, in some embodiments, when the acute angle $\theta_1$ and the distance $T_1$ are known, the distance $L_1$ may be changed by adjusting a location of the first micro light emitting device 120, to obtain a relatively large light reflection probability of the first light D1, and increase the light collimation of the first micro light emitting device 120. In other embodiments, when the acute angle $\theta_1$ is approximately 50°, $T_1/L_1>0.176$, and it can be ensured that relatively good light intensity of the first light D1 is obtained.

For the second micro light emitting device 130, as shown in FIG. 5B, one light (such as the second light D2) thereof emitted by the second light emitting layer 136 is reflected by a reflection point Q2 on at least one side surface (such as the second side surface 144 or the shared side surface 146), and the second light D2 is reflected to the protective layer 160. There is a shortest distance $T_2$ between a horizontally extended surface of a light emitting surface of the second light emitting layer 136 and the reflection point Q2. There is a shortest distance $L_2$ between the second micro light emitting device 130 and the reflection point Q2. There is an included angle $A_2$ between the second light D2 and a horizontally extended surface of a light emitting surface of the second light emitting layer 136. According to a principle similar to that in FIG. 5A, the included angle $A_2$ is approximately equal to a difference between twice the acute angle $\theta_1$ and the right angle (90°) (for example, the included angle $A_2=2\theta_1-90°$). When structure design of the second micro light emitting device 130 and the patterned photoresist layer 140 satisfies the following formula (2), a relatively good light guide effect of the second light D2 can be achieved (for example, the reflected second light D2 is substantially perpendicular to an upper surface (or an inner surface) of the substrate 110):

$$T_2 > L_1 \tan(A_2) \quad (2) \text{ or}$$

$$T_2 > L_1 \tan(2\theta_1 - 90°) \tag{2}$$

Based on this, when the acute angle $\theta_1$ and the distance $T_2$ are known, the distance $L_2$ may be changed by adjusting a location of the second micro light emitting device 130, to obtain a relatively large probability that the second light D2 is forward guided. In other embodiments, when the acute angle $\theta_1$ is approximately 50°, $T_2/L_2 > 0.176$, and it can be ensured that relatively good light intensity of the second light D1 is obtained.

Figure 6:
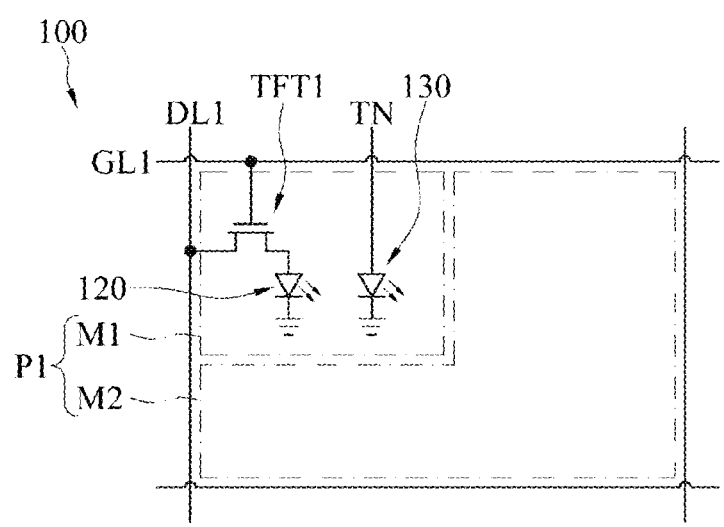
FIG. 6 is a schematic structural diagram of a circuit of a dual-sided display according to an embodiment of the present disclosure.

FIG. 6 is a schematic structural diagram of a circuit of a dual-sided display according to an embodiment of the present disclosure. In some embodiment s, referring to FIG. 6, the dual-sided display 100 further has multiple data lines (or referred to as first data lines DL1) and multiple gate lines (or referred to as first gate lines GL1). Each sub-pixel P1 corresponds to at least one first data line DL1 and at least one first gate line GL1, and each sub-pixel P1 is electrically connected to at least one first active device TFT1. In each sub-pixel P1, a control end of the first active device TFT1 is electrically connected to a corresponding first gate line GL1, an end of the first active device TFT1 is electrically connected to a corresponding first data line DL1, and the other end of the first active device TFT1 is electrically connected to an electrode (such as the second electrode 124) of the first micro light emitting device 120 thereof. Herein, a control signal of the first active device TFT1 is transmitted to the control end of the first active device TFT1 through the first gate line GL1, to control turning on or off of the first active device TFT1. That is, the first active device TFT1 may be used as a switch that turns on or off the first micro light emitting device 120.

Referring to FIG. 3 and FIG. 6, in some embodiments, the reflective electrode 150 is a reference potential electrode, and may be a common electrode (Vcom), a floating electrode (float), or an adjustable potential electrode. In some embodiments, the first conductive electrode 170 transmits a first potential, and the reflective electrode 150 transmits a second potential. There is a potential difference between the second potential provided by the reflective electrode 150 and the first potential provided by the first conductive electrode 170. Herein, first micro light emitting devices 120 may be separately turned on by controlling the first active device TFT1, so that the first micro light emitting devices 120 inside these sub-pixels P1 may be selectively lit up. In some embodiments, some or all second micro light emitting devices 130 may share a power line TN, so that second micro light emitting devices 130 located inside some or all sub-pixels P1 are simultaneously lit up by using the shared power line TN, or are lit up in different areas by using the shared power line TN for the different areas. For example, when a first micro light emitting device 120 is turned on and then lit up, and light emitted by the first micro light emitting device 120 penetrates the patterned photoresist layer 140 and is reflected on the reflective electrode 150, the light penetrates the substrate 110 and is emergent in a direction orientated towards the first side 112 of the substrate 110. In addition, when a second micro light emitting device 130 is turned on and then lit up, and light emitted by the second micro light emitting device 130 is reflected on the reflective electrode 150, the light is emergent in a direction orientated towards the first conductive electrode 170. Based on this, a beam emitted by the first micro light emitting device 120 and a beam emitted by the second micro light emitting device 130 are in opposite directions. Light from the first micro light emitting device 120 and light from the second micro light emitting device 130 may be respectively guided to the two opposite sides (for example, as shown in FIG. 3, the first side 112 and the second side 114 of the substrate 110) of the dual-sided display 100 by using the patterned photoresist layer 140 and the reflective electrode 150. The light from the first micro light emitting device 120 and the light emitted by the second micro light emitting device 130 do not interfere with each other. In some embodiments, when the first micro light emitting device 120 is turned on and then lit up, and light emitted by the first micro light emitting device 120 penetrates the patterned photoresist layer 140 and is reflected on the reflective electrode 150, the penetrates the substrate 110 and is emergent in a direction orientated towards the first side 112 of the substrate 110. However, the second micro light emitting device 130 is turned off and is not lit up, and may be used in a single-sided display. In another embodiment, the second micro light emitting device 130 is turned on and then lit up, light emitted by the second micro light emitting device 130 is reflected on the reflective electrode 150, and the light is emergent in a direction orientated towards the first conductive electrode 170. However, the first micro light emitting device 120 is turned off and is not lit up, and may be used in a single-sided display.

Referring to FIG. 7, in some embodiments, each sub-pixel P1 may further include another active device (or referred to as a second active device TFT2), and the second active device TFT2 is disposed on the substrate 110, as shown in FIG. 7. In each sub-pixel P1, the second active device TFT2 is electrically connected to the second micro light emitting device 130, so as to be used as a switch that controls turning on or off of the second micro light emitting device 130. In some embodiments, the insulation layer 180 covers the second active device TFT2, the insulation layer 180 has another contact hole (or referred to as a second contact hole W2), and by using a connecting electrode (or referred to as a second connecting electrode E2), the second active device TFT2 may fill into the second contact hole W2, so as to be electrically connected to the first conductive electrode 170, so that the second active device TFT2 can be electrically connected to an electrode (such as a fourth electrode 134) of the second micro light emitting device 130. In some embodiments, in a vertical projection direction orientated towards the substrate 110, projections of the first active device TFT1 and the second active device TFT2 do not overlap a projection of the first micro light emitting device 120, so that light emitted by the first micro light emitting device 120 is not blocked by the second active device TFT2 when the light is emergent towards the substrate 110. In another embodiment, the first active device TFT1 and/or the second active device TFT2 at least partially overlaps the second micro light emitting device 130 in the vertical projection direction orientated towards the substrate 110.

Figure 8:
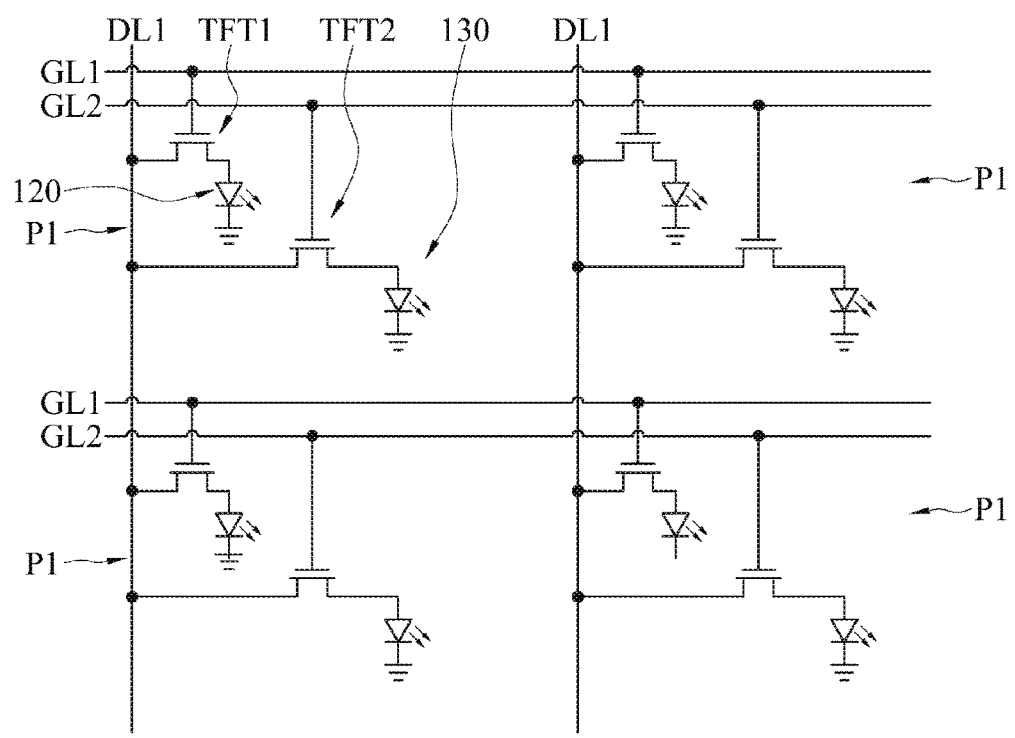
FIG. 8 is a schematic structural diagram of a circuit of a dual-sided display according to another embodiment of the present disclosure.
Figure 9:
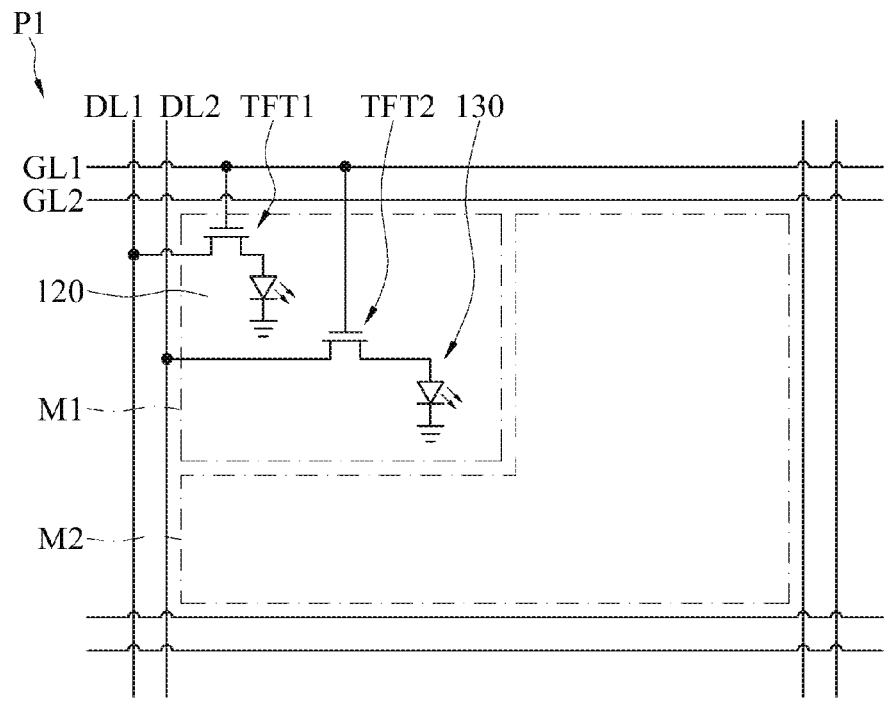
FIG. 9 is a schematic structural diagram of a circuit of a dual-sided display according to still another embodiment of the present disclosure.

In some embodiments, in addition to being corresponding to one first data line DL1 and one first gate line GL1, each sub-pixel P1 may further correspond to another gate line (or referred to as a second gate line GL2), as shown in FIG. 8. Herein, each sub-pixel P1 has the first active device TFT1 and the second active device TFT2, and both a first end of the first active device TFT1 and a first end of the second active device TFT2 are electrically connected to corresponding first data lines DL1. In each sub-pixel P1, a control end of the first active device TFT1 is electrically connected to a corresponding first gate line GL1, and a second end of the first active device TFT1 is electrically connected to an electrode (such as the second electrode 124) of the first micro light emitting device 120 thereof. In each sub-pixel P1, a control end of the second active device TFT2 is electrically connected to a corresponding second gate line GL2, and a second end of the second active device TFT2 is electrically connected to an electrode (such as the fourth electrode 134) of the second micro light emitting device 130 thereof. Herein, a control signal of the first active device TFT1 is transmitted by the first gate line GL1 to the first active device TFT1, to control turning on or off of the first active device TFT1. A control signal of the second active device TFT2 is transmitted to the second active device TFT2 through the second gate line GL2, to control turning on or off of the second active device TFT2. For example, each first micro light emitting device 120 may be separately turned on by controlling the first active device TFT1 corresponding to the first micro light emitting device 120, and each second micro light emitting device 130 may be separately turned on by controlling the second active device TFT2 corresponding to the second micro light emitting device 130. In other embodiments, in addition to being corresponding to one first data line DL1, one first gate line GL1, and one second gate line GL2, each sub-pixel P1 may further correspond to another gate line (hereinafter referred to as a second data line DL2), as shown in FIG. 9. Herein, each sub-pixel P1 has the first active device TFT1 and the second active device TFT2, and a first end of the first active device TFT1 and a first end of the second active device TFT2 are respectively electrically connected to a corresponding first data line DL1 and a corresponding second data line DL2.

Figure 10:
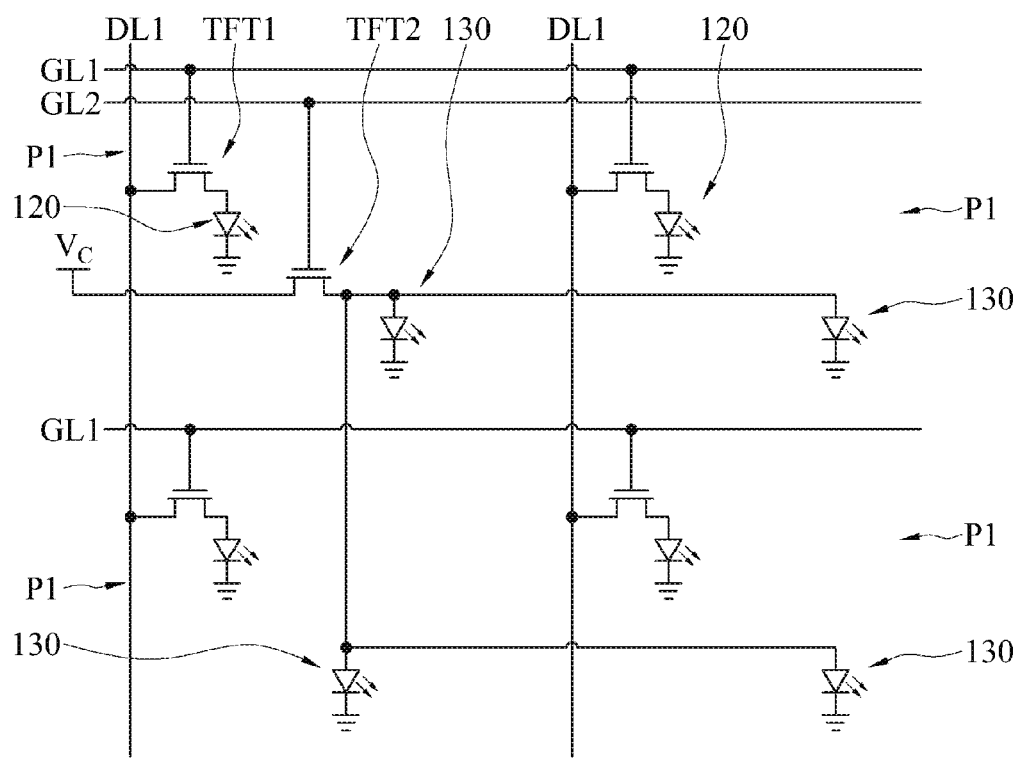
FIG. 10 is a schematic structural diagram of a circuit of a dual-sided display according to yet another embodiment of the present disclosure.

In some embodiments, in addition to a case in which each sub-pixel P1 corresponds to one first data line DL1 and one first gate line GL1, some or all sub-pixels P1 (multiple sub-pixels P1) may share one second active device TFT2 and one shared gate line (such as the second gate line GL2), as shown in FIG. 10. In this case, a control end of the shared second active device TFT2 is electrically connected to the shared second gate line GL2, a first end of the shared second active device TFT2 is electrically connected to a power supply Vc, and a second end of the second active device TFT2 is electrically connected to electrodes (such as the fourth electrode 134) of second micro light emitting devices 130 of multiple sub-pixels P1 that share the second active device TFT2. Herein, each first micro light emitting device 120 may be turned on by controlling the corresponding first active device TFT1, and each second micro light emitting device 130 may be turned on by controlling the shared second active device TFT2. That is, multiple or all second micro light emitting devices 130 may be turned on by controlling a same second active device TFT2.

In some embodiments, a brightness difference between the two sides (the first side 112 and the second side 114 of the substrate 110) of the dual-sided display 100 may be adjusted by changing a quantity, an arrangement location, or a size of the first micro light emitting device 120 or the second micro light emitting device 130. Herein, a device disposition structure and a connection relationship are roughly similar to those in the foregoing description. For example, the patterned photoresist layer 140 covers the first micro light emitting device 120 and forms a through accommodating groove (that is, the second opening H2), to dispose the second micro light emitting device 130, and a potential is provided for the first micro light emitting device 120 and the second micro light emitting device 130 by using the reflective electrode 150. There are respectively potential differences between a potential of the reflective electrode 150 and potentials of the second electrode 124 and the fourth electrode 134. Directions of light emitted by the first micro light emitting device 120 and the second micro light emitting device 130 are opposite to a direction of light emitted by the dual-sided display 100. For example, the first micro light emitting device 120 is located between the reflective electrode 150 and the substrate 110, and the reflective electrode 150 is located between the second micro light emitting device 130 and the substrate 110. In addition, by using the patterned photoresist layer 140, the reflective electrode 150 provides the first micro light emitting device 120 with a reflecting surface that reflects light to the substrate 110 and provides the second micro light emitting device 130 with a reflecting surface that reflects light away from the substrate 110. That illuminance of the second side 114 of the substrate 110 is increased is described in FIG. 11A, FIG. 11B, and FIG. 11C. However, in other different embodiments, brightness of the first side 112 of the substrate 110 may also be adjusted by using a similar design.

Figure 11A:
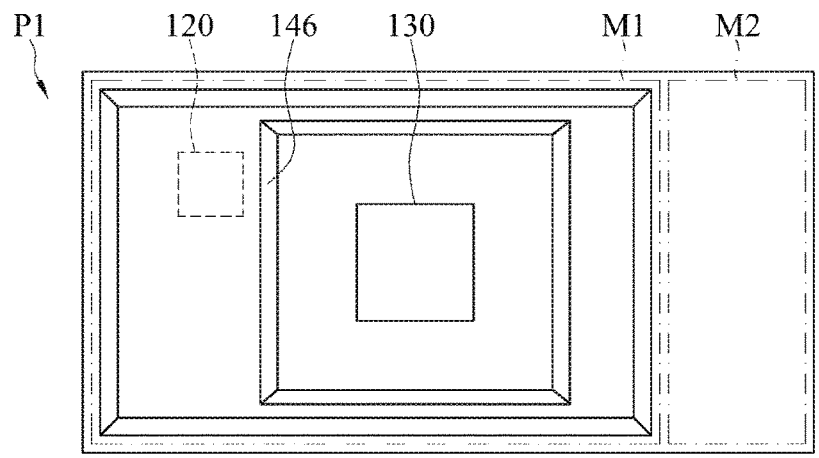
FIG. 11A is a schematic top view of a structure of a dual-sided display according to another embodiment of the present disclosure.

In still some embodiments, as shown in FIG. 11A, a first micro light emitting device 120 and a second micro light emitting device 130 that are of different sizes may be disposed in each sub-pixel P1. Herein, a relationship of connection between and a manner of operation between the first micro light emitting device 120 and the second micro light emitting device 130, and another device are roughly the same as those in the foregoing embodiments, and therefore details are not described again. A size of the first micro light emitting device 120 is less than a size of the second micro light emitting device 130. That is, a size of the second light emitting layer 136 of the second micro light emitting device 130 is greater than a size of the first light emitting layer 126 of the first micro light emitting device 120, thereby increasing illuminance of the second side 114 of the substrate 110.

Figure 11B:
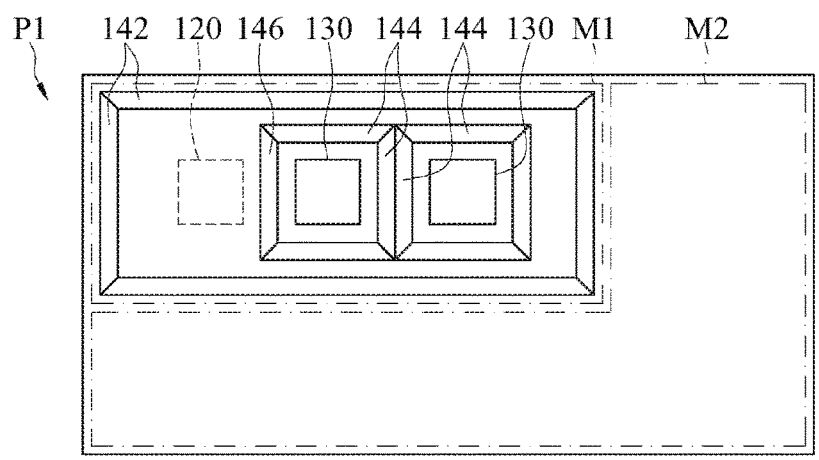
FIG. 11B is a schematic top view of a structure of a dual-sided display according to still another embodiment of the present disclosure.

In other embodiments, as shown in FIG. 11B, multiple second micro light emitting devices 130 may be disposed in each sub-pixel P1, thereby increasing illuminance of the second side 114 of the substrate 110. Two second micro light emitting devices 130 are used as an example. These micro light emitting devices (for example, one first micro light emitting device 120 and two second micro light emitting devices 130) are arranged in a one dimensional array. A location of the first micro light emitting device 120 may be but is not limited to between the two second micro light emitting devices 130 (which is not shown in the figure), or may be adjacent to either of the two second micro light emitting devices 130 (as shown in FIG. 11B). Herein, a relationship of connection between and a manner of operation between the first micro light emitting device 120 and the second micro light emitting device 130, and another device are roughly the same as those in the foregoing embodiments, and therefore details are not described again.

Figure 11C:
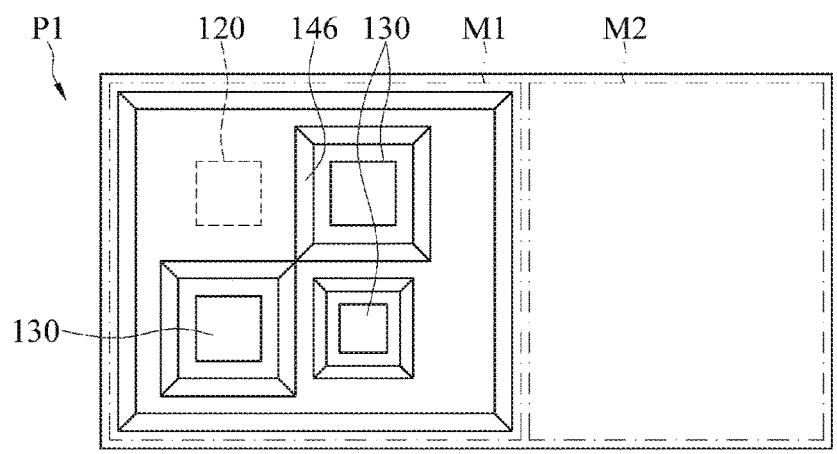
FIG. 11C is a schematic top view of a structure of a dual-sided display according to yet another embodiment of the present disclosure.

Three second micro light emitting devices 130 are further used as an example, as shown in FIG. 11C. These micro light emitting devices (for example, one first micro light emitting device 120 and three second micro light emitting devices 130) are arranged in a two-dimensional array, such as but not limited to a square matrix. Herein, these second micro light emitting devices 130 may have a same size, or may have different sizes. In the foregoing embodiments, for example, in any figure of FIG. 1 to FIG. 11B, a quantity of first micro light emitting devices 120 and a quantity of second micro light emitting devices 130 are respectively at least one or multiple. Herein, a relationship of connection between and a manner of operation between the first micro light emitting device 120 and the second micro light emitting device 130, and another device are roughly the same as those in the foregoing embodiments, and therefore details are not described again.

In some embodiments, a sub-pixel P1 may include at least one light emitting area M1, and additionally the sub-pixel P1 may selectively include at least one penetration area M2 that is adjacent to a light emitting area M1, as shown in FIG. 1, FIG. 2, and FIG. 3. For example, the patterned photoresist layer 140, the reflective electrode 150, the first micro light emitting device 120, and the second micro light emitting device 130 are located in the light emitting area M1; in addition, the reflective electrode 150 is not distributed in the penetration area M2. Herein, the first micro light emitting device 120 and the second micro light emitting device 130 emit, in the light emitting area M1, different light towards the two opposite sides of the dual-sided display 100, and ambient light penetrates the penetration area M2, so that the penetration area M2 of the sub-pixel P1 of the dual-sided display 100 is translucent, to increase transmittance of the dual-sided display 100. The penetration area M2 may selectively include a transparent film layer (such as an insulation layer, a protective layer, or another proper film layer) and the substrate 110, or include only the substrate 110. A shape of a vertical projection of the penetration area M2 onto the substrate 110 may be a polygon, such as a L shape, an I shape, a square shape, a round shape, an annular shape, a bending shape, or another proper shape. If the transmittance is enough, the dual-sided display 100 may alternatively be referred to as a transparent dual-sided display. In some embodiments, the penetration area M2 is used to allow ambient light to penetrate. This may also be applied to the foregoing embodiments, as shown in FIG. 6 to FIG. 11.

Figure 12:
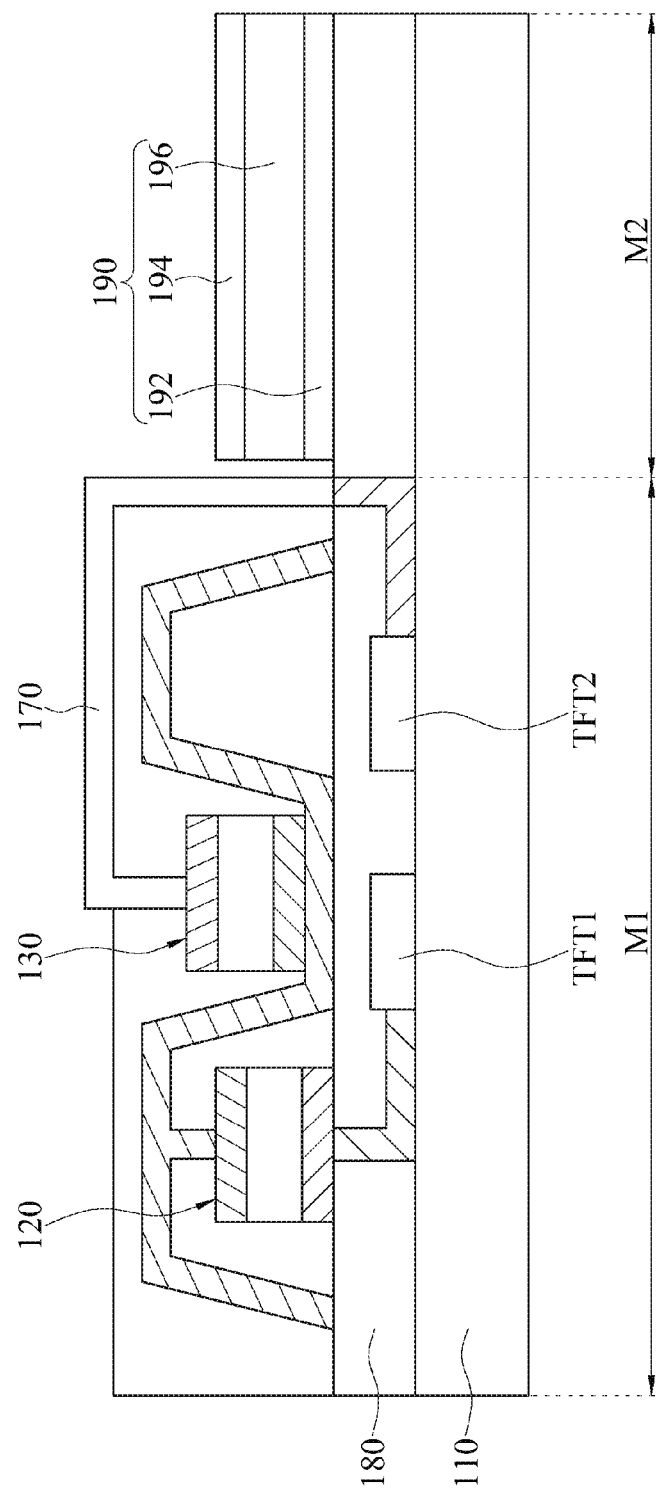
FIG. 12 is a schematic structural diagram of a cross section of a dual-sided display according to another embodiment of the present disclosure.

As shown in FIG. 12, in some other embodiments, to modulate the transmittance of the penetration area M2 of the sub-pixel P1, each sub-pixel P1 may further include a light modulation device 190, and the light modulation device 190 is at least disposed on the substrate 110 of the penetration area M2. The light modulation device 190 and the first conductive electrode 170 are not electrically connected. The light modulation device 190 may include other two conductive electrode (such as a second conductive electrode 192 and a third conductive electrode 194) and a light modulation layer 196. The light modulation layer 196 is disposed between the second conductive electrode 192 and the third conductive electrode 194. When a voltage is applied to the second conductive electrode 192 and the third conductive electrode 194, an electric field is formed between the light modulation layer 196, and the second conductive electrode 192 and the third conductive electrode 194. The light modulation layer 196 is controlled, so that a status of the light modulation layer 196 is changed according to the electric field, then penetration of light in the penetration area M2 covered by the light modulation device 190 is changed, and then a contrast value between images presented on the two opposite sides of the dual-sided display 100.

In some embodiments, either of the second conductive electrode 192 and the third conductive electrode 194 may be a single-layer or multi-layer structure, and a material thereof may preferably be a transparent conductive material (such as zinc oxide, indium zinc oxide, gallium zinc oxide, zinc tin oxide, indium tin oxide, metal or alloy less than 60 Angstrom, a nano carbon pipe or bar, or another proper material), or another proper material. In some embodiments, either of the second conductive electrode 192 and the third conductive electrode 194 may further include a reflective material (such as metal, alloy, or another proper material), and a size of the reflective material is less than a size of the transparent conductive material, to prevent a function of the light modulation device 190 from declining.

Figure 13:
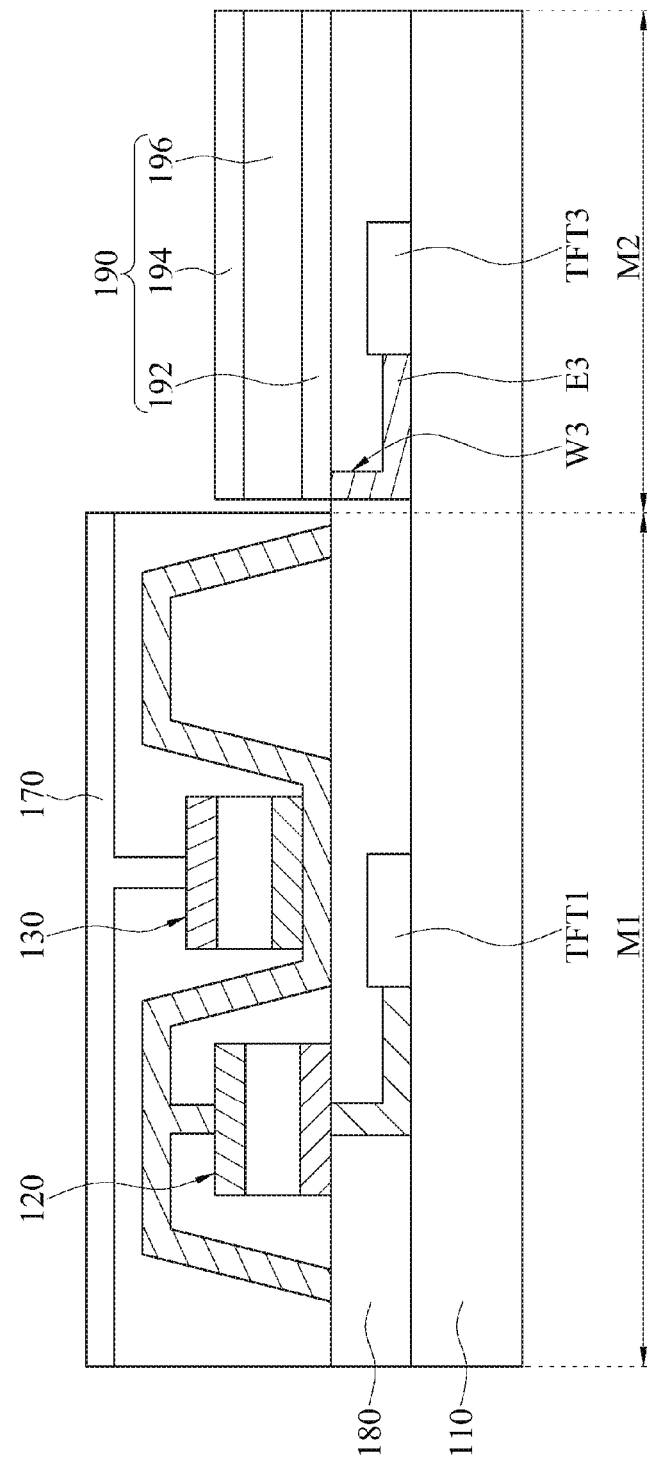
FIG. 13 is a schematic structural diagram of a cross section of a dual-sided display according to another embodiment of the present disclosure.

In some embodiments thereof, each sub-pixel P1 may selectively further include a switch device TFT3, and the switch device TFT3 is electrically connected to an electrode (such as the second conductive electrode 192) of the light modulation device 190. Herein, the switch device TFT3 may be used as a switch that controls the light modulation device 190, as shown in FIG. 13. In some embodiments, the insulation layer 180 covers the switch device TFT3 and the substrate 110, the insulation layer 180 may further include another contact hole (hereinafter referred to as a through-hole W3), and the switch device TFT3 may be electrically connected to the second conductive electrode 192 of the light modulation device 190 by using a connecting electrode (such as a third connecting electrode E3). In some embodiments, in a vertical projection direction orientated towards the substrate 110, a projection of the connecting electrode (such as the third connecting electrode E3) does not overlap a projection of the first micro light emitting device 120, so that light emitted by the first micro light emitting device 120 is not blocked by the connecting electrode (such as the third connecting electrode E3) when the light is emergent towards the substrate 110.

In some embodiments, some or all sub-pixels P1 (multiple sub-pixels P1) may control light modulation devices 190 thereof by using a same switch device TFT3. In an embodiment, the shared switch device TFT3 may be disposed in one of multiple sub-pixels P1 that share the switch device TFT3, and connected to another sub-pixel P1 by using an intraconnection line. Alternatively, in another embodiment, the shared switch device TFT3 may be disposed outside of the multiple sub-pixels P1 that share the switch device TFT3, and connected to each other by using an intraconnection line.

Herein, by using different switch design (such as the first active device TFT1, the second active device TFT2, or the switch device TFT3), the dual-sided display 100 may adjust brightness or transmittance that are presented on the two opposite sides of the dual-sided display 100.

In some embodiments, the first micro light emitting device 120 located in the sub-pixel P1 may be separately turned on by controlling an active device (such as the first active device TFT1), and the second micro light emitting device 130 located in the sub-pixel P1 may be separately turned on by controlling an active device (such as the second active device TFT2). Light modulation devices 190 (no switch device TFT3 is disposed) in some or all sub-pixels P1 may be electrically connected to a shared switch (not shown in the figure) by using the second conductive electrode 192 and the third conductive electrode 194 or by using another electrode (not shown in the figure), so that fixed penetration is maintained for penetration areas M2 in some or all sub-pixels P1, as shown in FIG. 12.

In some embodiments, the first micro light emitting device 120 may be turned on by controlling an active device (such as the first active device TFT1), the second micro light emitting device 130 is constantly lit up (no second active device TFT2 is disposed), and the light modulation device 190 may adjust penetration of the penetration area M2 by controlling the switch device TFT3, as shown in FIG. 13.

Figure 14:
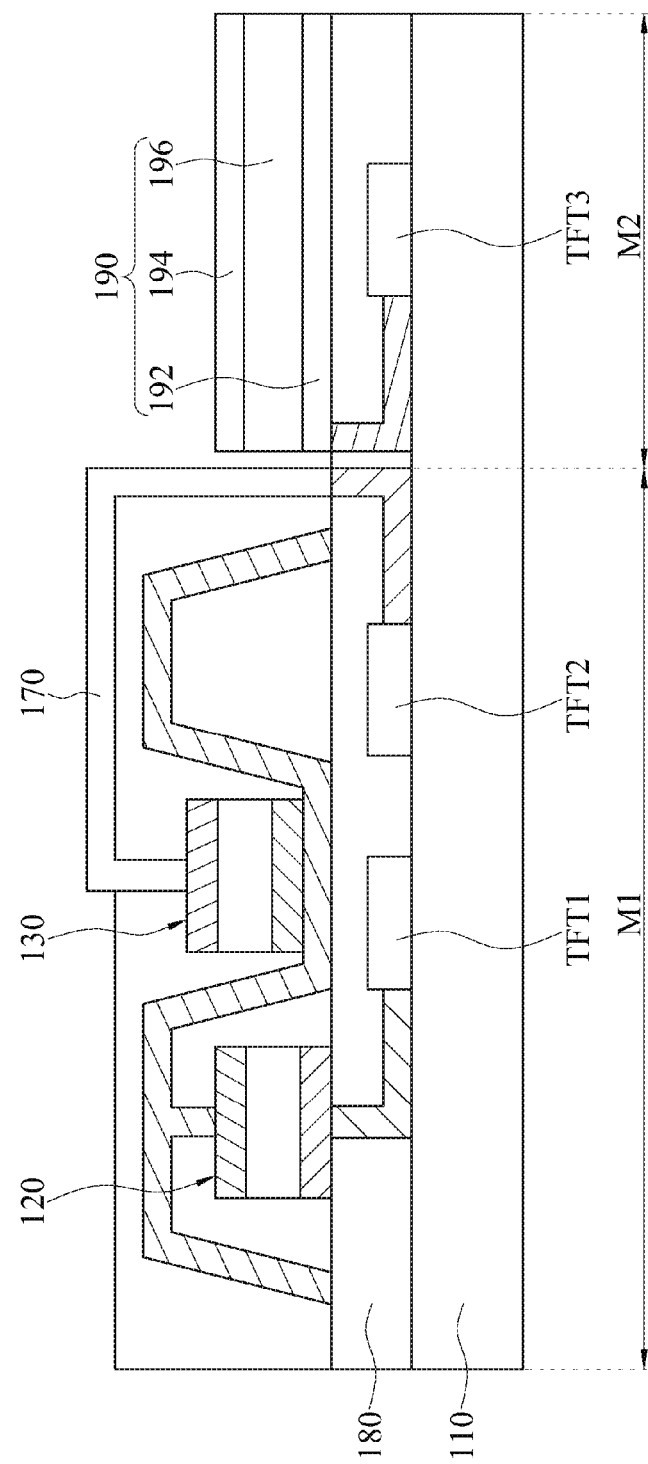
FIG. 14 is a schematic structural diagram of a cross section of a dual-sided display according to another embodiment of the present disclosure.

As shown in FIG. 14, in addition, in some embodiments, the first micro light emitting device 120 may be turned on by controlling an active device (such as the first active device TFT1), the second micro light emitting device 130 may be turned on by controlling an active device (such as the second active device TFT2), and the light modulation device 190 may adjust the penetration of the penetration area M2 by controlling the switch device TFT3. In these embodiments, by turning on or off the first active device TFT1, the second active device TFT2, and the switch device TFT3, the dual-sided display 100 may adjust a contrast value between images presented on the two opposite sides of the dual-sided display 100. For example, in an example, when being in a transparent display mode, the dual-sided display 100 turns on the first micro light emitting device 120 by controlling the first active device TFT1, controls the second active device TFT2 to turn on the second micro light emitting device 130, and controls the switch device TFT3 to turn off or on the light modulation device 190, to make presentation of the light modulation device 190 transparent. Herein, the light emitting area M1 of the sub-pixel P1 of the dual-sided display 100 can display different light towards two opposite sides, and the penetration area M2 is translucent. In this case, the dual-sided display 100 may be further referred to as a transparent dual-sided display. In another example, when being in a high-contrast display mode, the dual-sided display 100 turns on the first micro light emitting device 120 by controlling an active device (such as the first active device TFT1), turns off the second micro light emitting device 130 by controlling an active device (such as the second active device TFT2), and turns on or off the light modulation device 190 by controlling the switch device TFT3, so that light penetration of the light modulation device 190 is reduced and light cannot penetrate the penetration area M2. Herein, the light emitting area M1 of the sub-pixel P1 of the dual-sided display 100 can display different light towards two opposite sides, the penetration area M2 cannot be translucent to conceal an image in the background, and then the contrast value between images presented on the two opposite sides of the dual-sided display 100 can be increased.

In some embodiments, the light modulation device 190 may have different categories, and based on this, may selectively control, by using different mechanisms, the light modulation layer 196 (such as an electrochromic material, a polar material, a liquid crystal material, or another proper material) to change a status of the light modulation layer 196 according to an electric field.

In some embodiments, the light modulation layer 196 may be an electrochromic layer, and control a color change of the electrochromic layer by controlling voltages of the second conductive electrode 192 and the third conductive electrode 194, so as to modulate penetration of ambient light of the penetration area M2. In some embodiments thereof, a material of the electrochromic layer may be but is not limited to tungsten oxide (WO3), Ni oxide (NiOx), Vanadium pentoxide (V2O5), or other proper material.

In other embodiments, the light modulation layer 196 may be an electro wetting layer (including polar liquid and non-polar liquid). Electric charge of the non-polar liquid changes by controlling voltages of the second conductive electrode 192 and the third conductive electrode 194, so that relationship between the polar liquid and non-polar liquid changes. The electric wetting layer presents in a contracted or flat status, so as to modulate penetration of ambient light of the penetration area M2.

Figure 15:
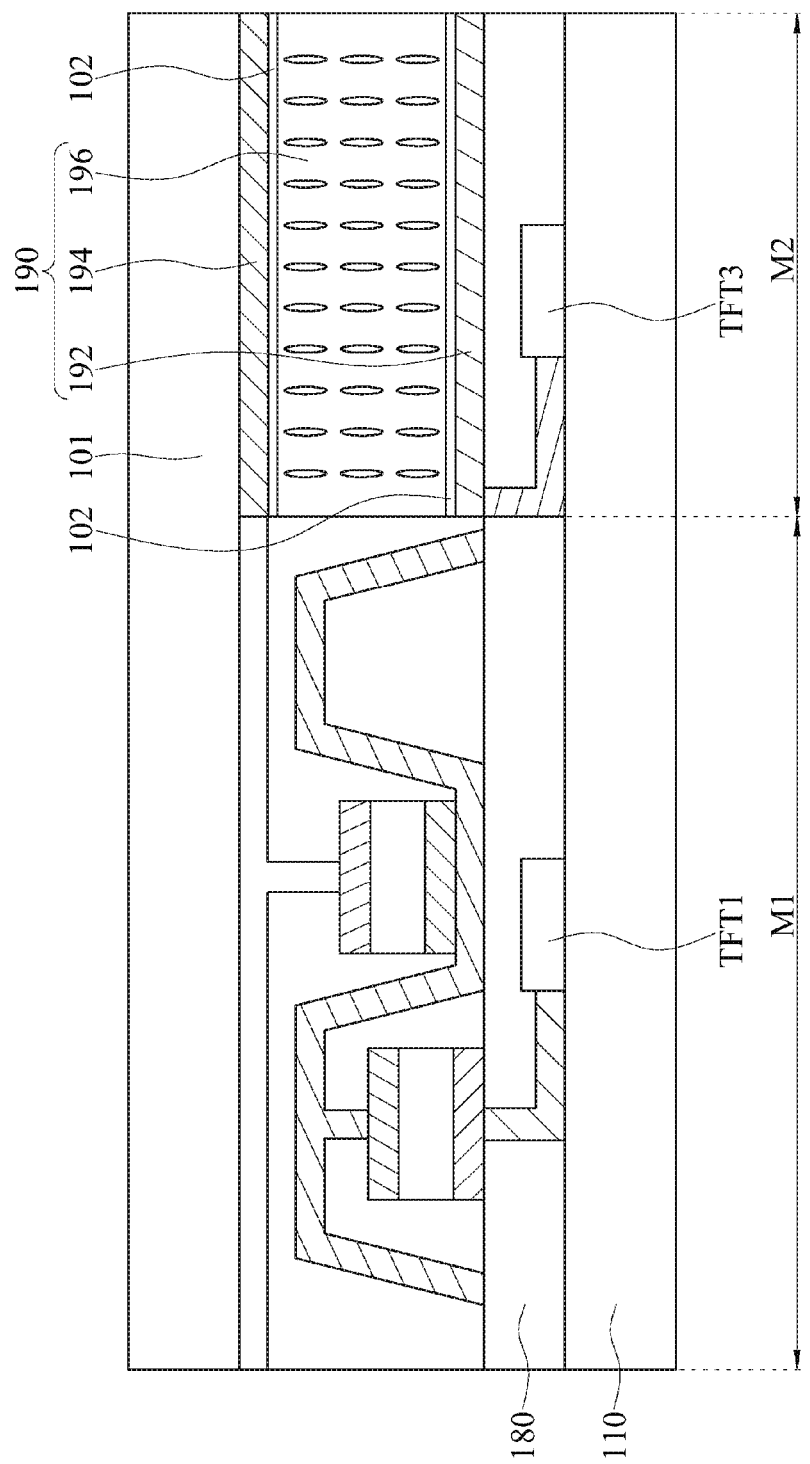
FIG. 15 is a schematic structural diagram of a cross section of a dual-sided display according to still another embodiment of the present disclosure.

In some embodiments, as shown in FIG. 15, the light modulation layer 196 may be a liquid crystal layer. In those embodiments, the dual-sided display 100 may further include an opposite substrate 101 and at least one alignment layer (such as two alignment layers) 102, the opposite substrate 101 is disposed on the second side 114 of the substrate 110, the third conductive electrode 194 of the light modulation device 190 is located on the opposite substrate 101, and the two alignment layers 102 are respectively located on the second conductive electrode 192 of the substrate 110 and the third conductive electrode 194 of the substrate 101. A rotation direction of the liquid crystal layer is controlled by controlling voltages of the second conductive electrode 192 and the third conductive electrode 194, so as to modulate penetration of ambient light of the penetration area M2. This embodiment may be referred to as vertical electric field switching. In another embodiment, the third conductive electrode 194 and the second conductive electrode 192 are disposed on the substrate 110, and there is no electrode on the opposite substrate 101. A rotation direction of the liquid crystal layer is controlled by controlling voltages of the second conductive electrode 192 and the third conductive electrode 194, so as to modulate penetration of ambient light of the penetration area M2. This embodiment may be referred to as horizontal electric field switching. In still another embodiment, the third conductive electrode 194 and the second conductive electrode 192 are disposed on the substrate 110, and additionally an additional electrode (not shown in the figure) is disposed on the opposite substrate 101. A rotation direction of the liquid crystal layer is controlled by controlling voltages of the second conductive electrode 192, the third conductive electrode 194, and the additional electrode, so as to modulate penetration of ambient light of the penetration area M2. This embodiment may be referred to as composite electric field switching (including horizontal and vertical electric field switching).

Figure 16:
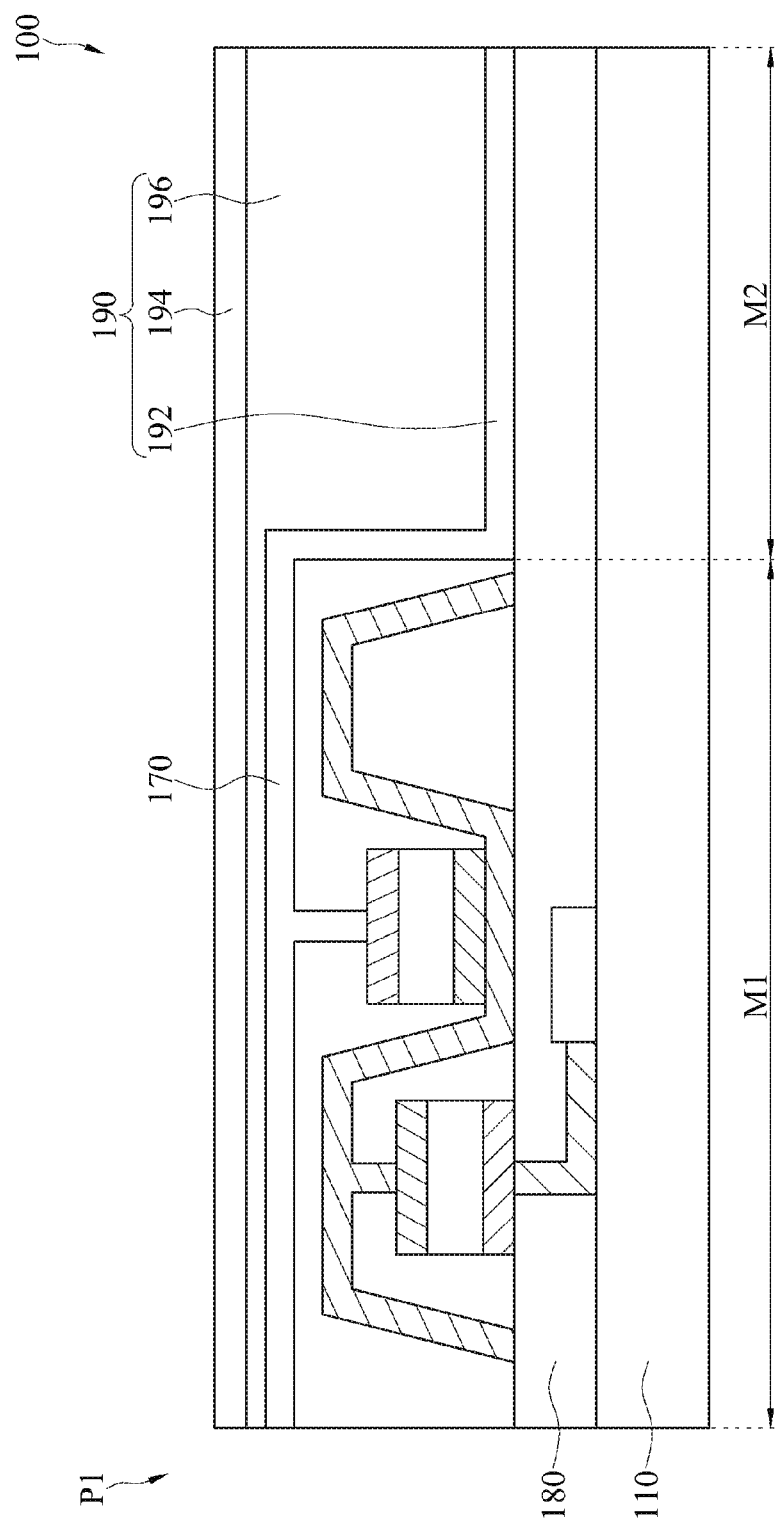
FIG. 16 is a schematic structural diagram of a cross section of a dual-sided display according to still another embodiment of the present disclosure.

In other embodiments, as shown in FIG. 16, to be capable of modulating transmittance of the light emitting area M1, the light modulation device 190 may be selectively disposed on the substrate 110 of the light emitting area M1 and the penetration area M2, in addition to the penetration area M2 of the sub-pixel P1. That is, the light modulation device 190 may cover the sub-pixel P1. The second conductive electrode 192 of the light modulation device 190 may be connected to the first conductive electrode 170, and the third conductive electrode 194 of the light modulation device 190 may extend from the penetration area M2 to the light emitting area M1.

In some other embodiments, an image may be displayed only on one side of the dual-sided display 100 and the other side may be used only for lighting; alternatively, an image may be displayed on two opposite sides of the dual-sided display 100. Based on this, a category of the first micro light emitting device 120 and a category of the second micro light emitting device 130 may be the same or different.

In some embodiments, the first micro light emitting device 120 may be but is not limited to a red light emitting diode, a blue light emitting diode, a green light emitting diode, a yellow light emitting diode, or a white light emitting diode, and the second micro light emitting device 130 is a white light emitting diode. A color that is displayed on the first side 112 of the substrate 110 by each sub-pixel P1 of the dual-sided display 100 may be but is not limited to red, blue, green, yellow, or white. In addition, a light color that is displayed on the second side 114 of the substrate 110 by each sub-pixel P1 of the dual-sided display 100 is white, and may be used to provide lighting for an object. In some embodiments, the dual-sided display 100 may be applied to a commodity window. For example, the first micro light emitting device 120 may be used to display a picture, and the second micro light emitting device 130 is used to illuminate a displayed article, so that an image, a pattern, text, or the like is displayed on one side of the dual-sided display 100, and light needed for illuminating a commodity in the window is provided on the other side of the dual-sided display 100. In other embodiments, the first micro light emitting device 120 and the second micro light emitting device 130 may be but is not limited to a red light emitting diode, a blue light emitting diode, a green light emitting diode, a yellow light emitting diode, or a white light emitting diode, two sides of the dual-sided display 100 may be used to display an image, a pattern, text, or the like, and pictures displayed on the two sides may be the same, or may be different.

In still some embodiments, the first micro light emitting device 120 may be but is not limited to a red light emitting diode, a blue light emitting diode, a green light emitting diode, a yellow light emitting diode, or a white light emitting diode, and the second micro light emitting device 130 may be but is not limited to a red light emitting diode, a blue light emitting diode, a green light emitting diode, a yellow light emitting diode, or a white light emitting diode. In some embodiments, the dual-sided display 100 may be applied to a billboard, and the two sides of the dual-sided display 100 may be used to display an image, a pattern, text, or the like. Herein, pictures displayed on the two sides of the dual-sided display 100 may be the same, or may be different.

Figure 17:
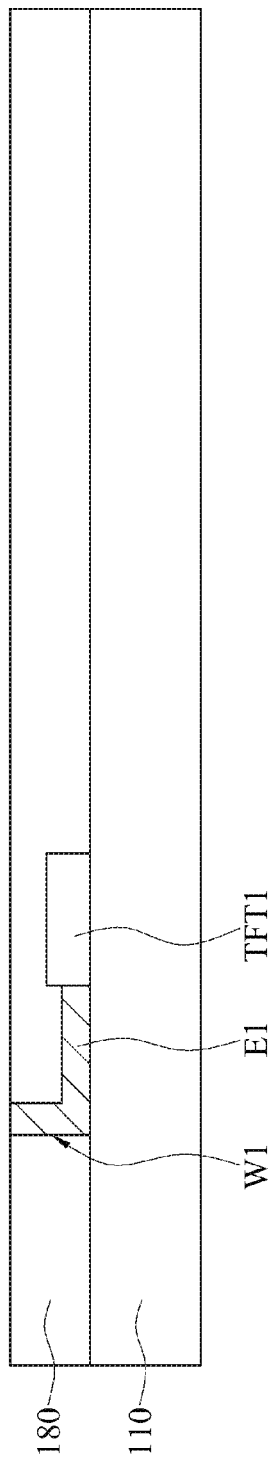
FIG. 17 to FIG. 24 are respectively schematic sectional views formed in steps in a method for fabricating a dual-sided display according to an embodiment of the present disclosure.
Figure 18:
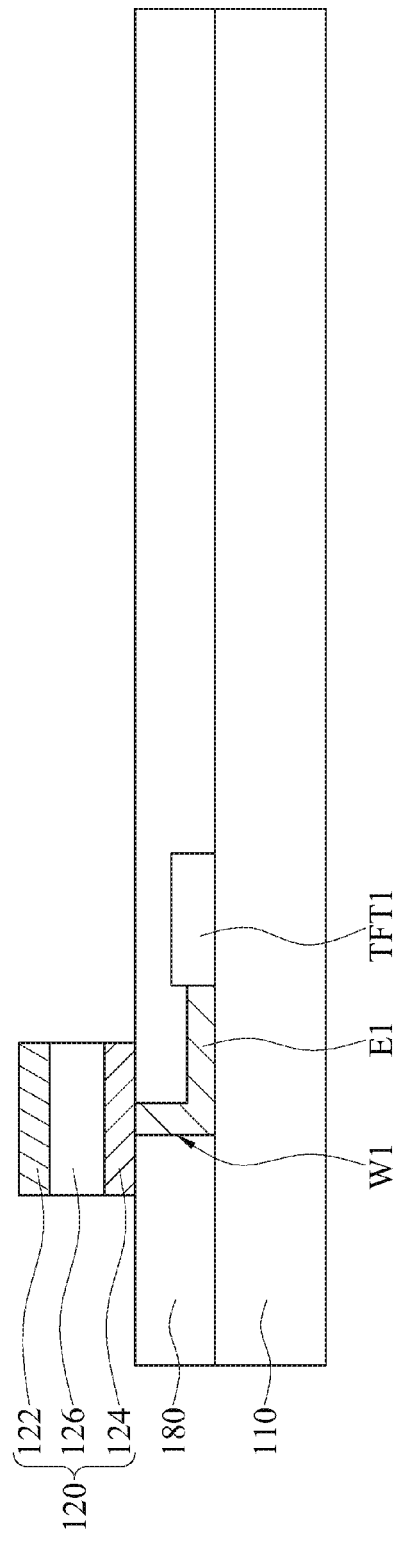
Figure 19:
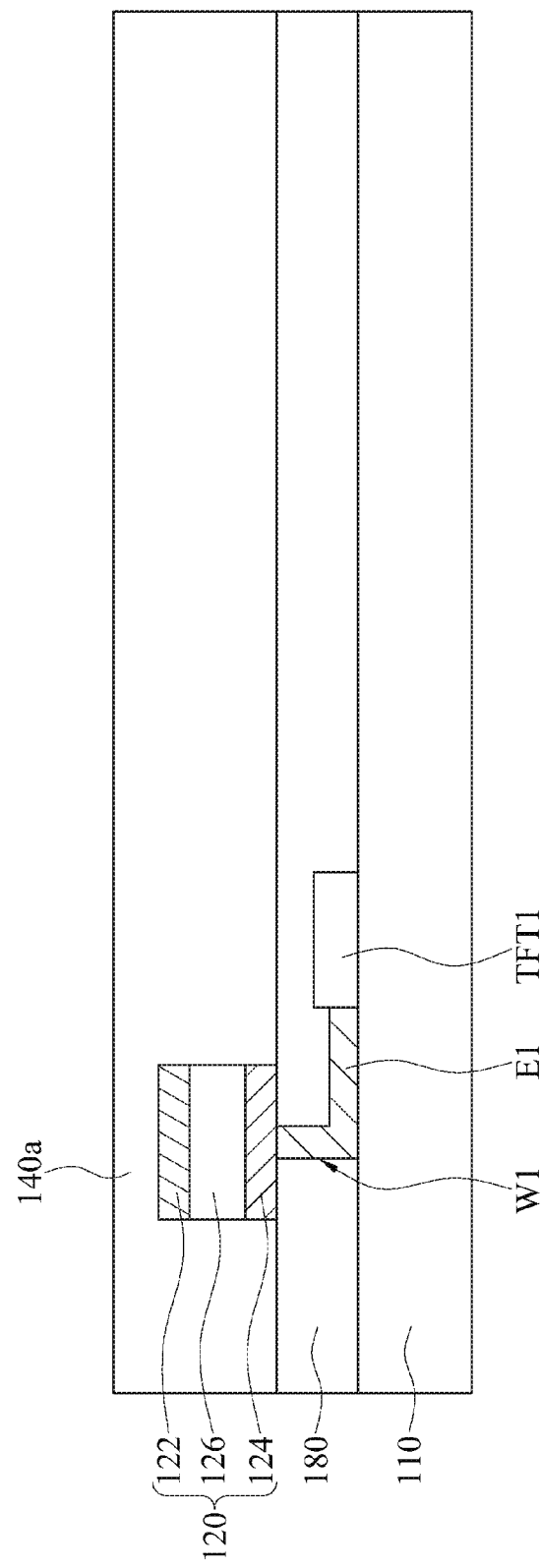
Figure 20:
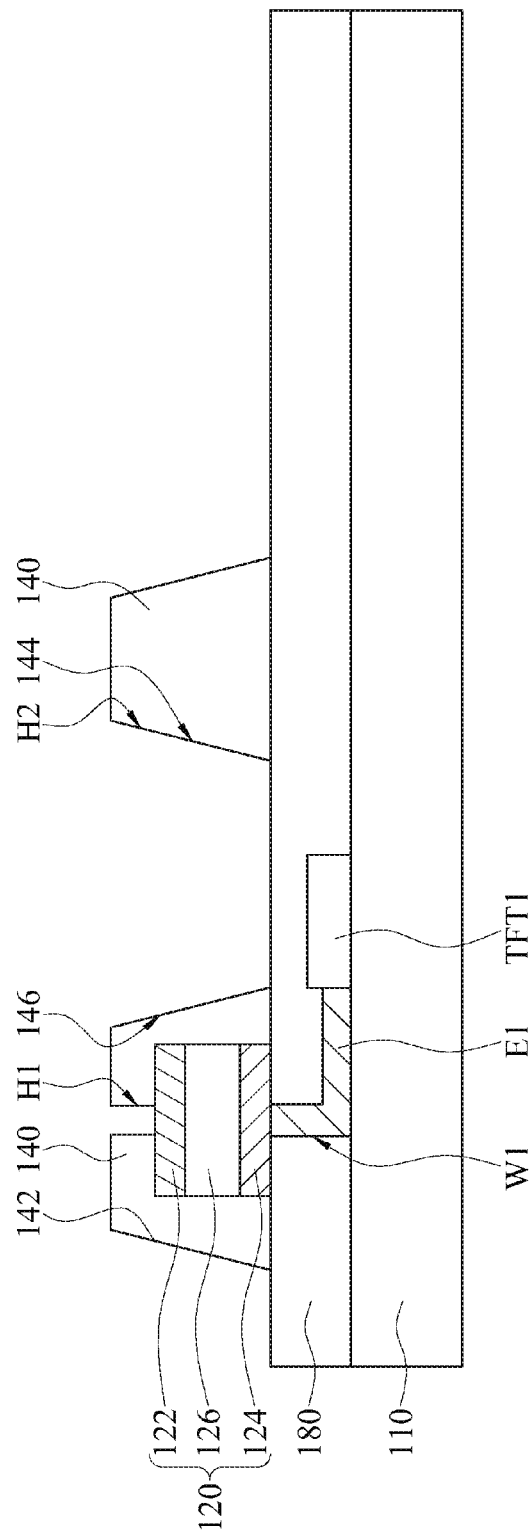
Figure 21:
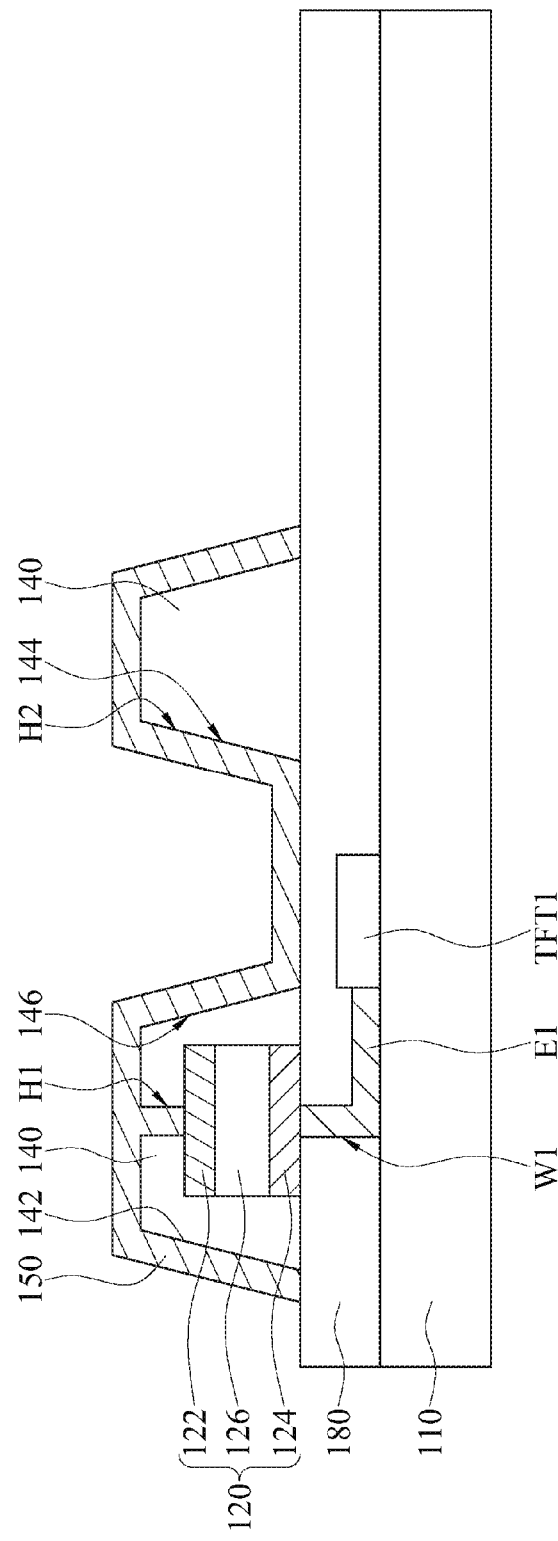
Figure 22:
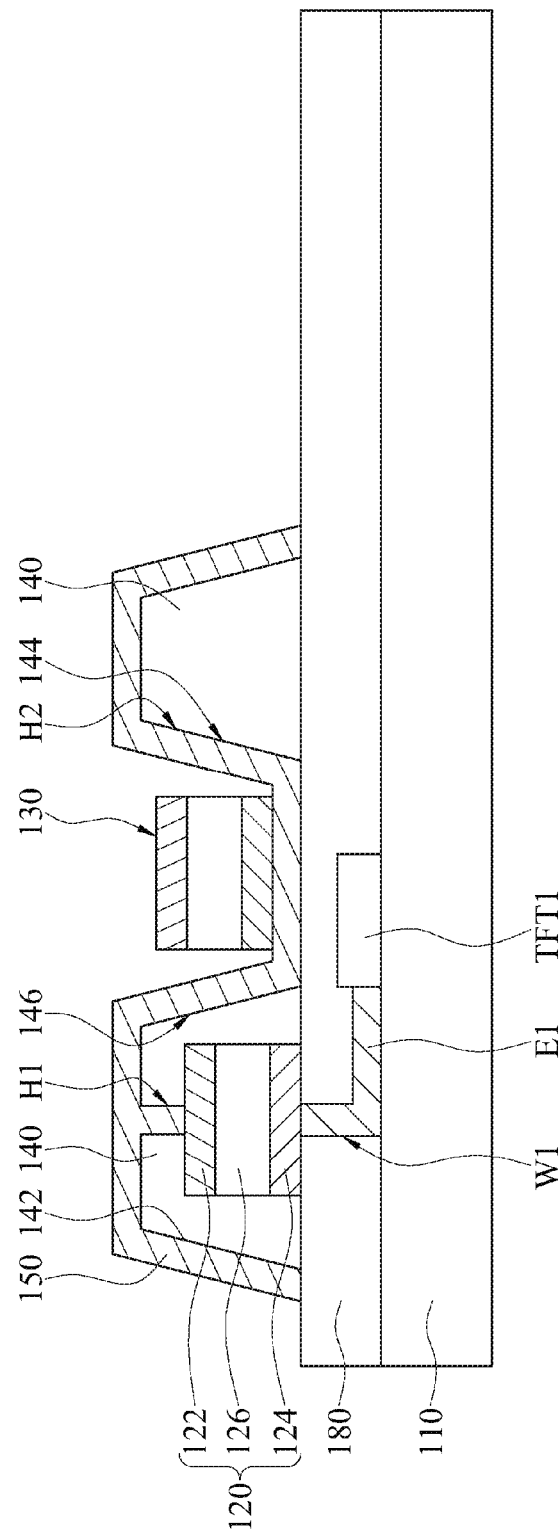
Figure 23:
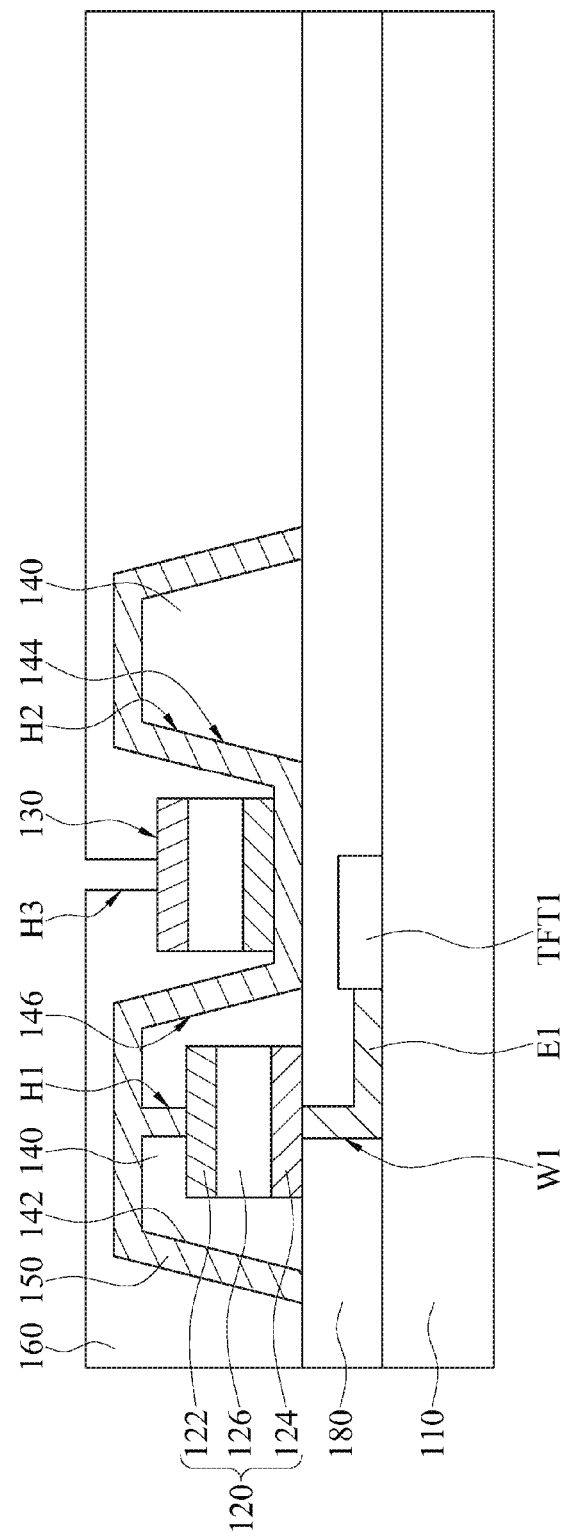
Figure 24:
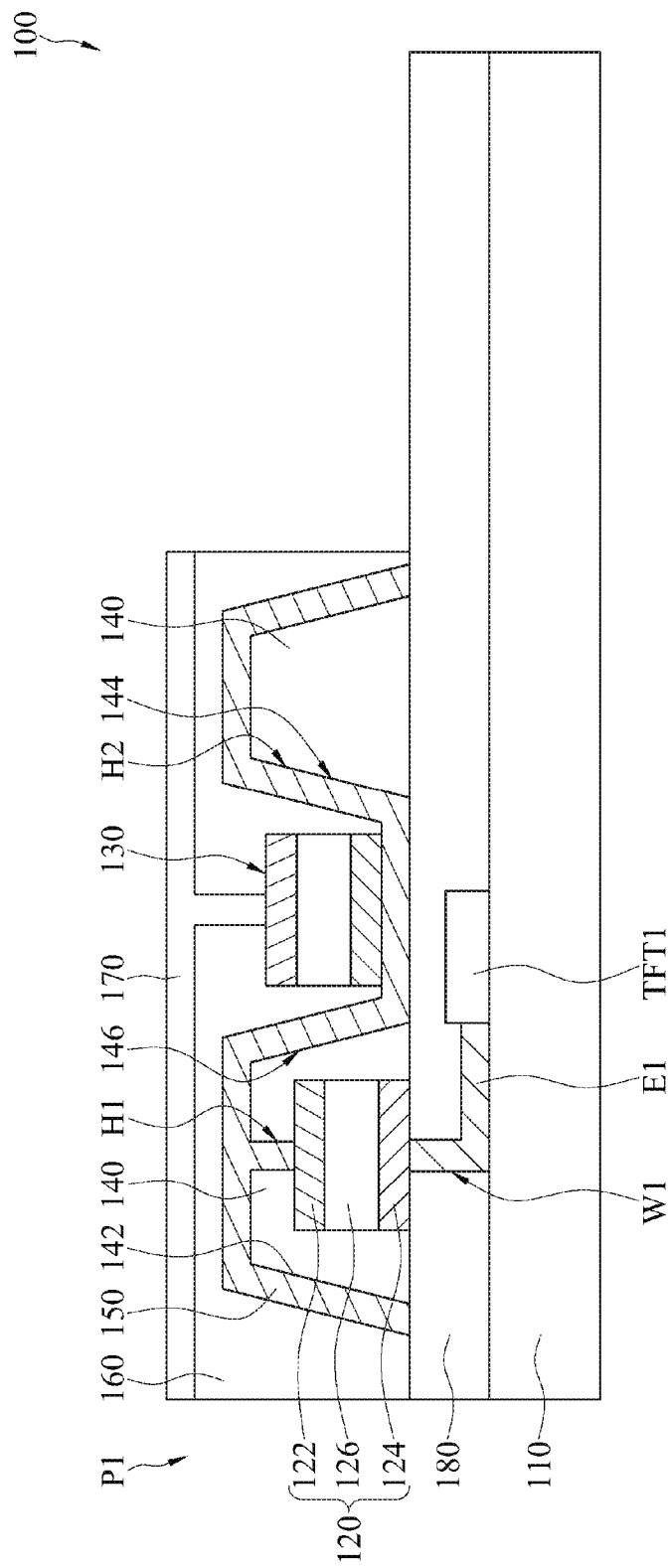

FIG. 17 to FIG. 24 are schematic sectional diagrams formed in steps in a method for fabricating a dual-sided display according to an embodiment of the present disclosure. The method for fabricating a dual-sided display includes: forming, in a light emitting area M1 of a substrate 110, a first active device TFT1 (as shown in FIG. 17); disposing, on the light emitting area M1 of the substrate 110, a first micro light emitting device 120, to electrically connect the first active device TFT1 (as shown in FIG. 18); forming, on the substrate 110, a photoresist layer that covers the first micro light emitting device 120 (as shown in FIG. 19); patterning a photoresist layer 140a to form a patterned photoresist layer 140 (as shown in FIG. 20); covering, with a reflective electrode 150, the patterned photoresist layer 140 and the substrate 110 that is exposed at a second opening H2 of the patterned photoresist layer 140 (as shown in FIG. 21); disposing a second micro light emitting device 130 on the reflective electrode 150 inside the second opening H2 (as shown in FIG. 22); forming a protective layer 160 to cover the reflective electrode 150 and a portion of the second micro light emitting device 130 (as shown in FIG. 23); and forming a first conductive electrode 170 on a protective layer 160 (as shown in FIG. 24). In some embodiments, the substrate 110 may be a substrate transcluent, such as a transparent substrate or a semitransparent substrate. In some embodiments, for example, the substrate 110 may be but is not limited to a glass substrate or a sapphire substrate.

In some embodiments, the first active device TFT1 is formed on the substrate 110, to form an entire insulation layer 180 to cover the first active device TFT1 and the substrate 110, and then form a first contact hole W1 at a first active device TFT1 corresponding to the insulation layer 180. The first contact hole W1 is in communication with the first active device TFT1 and a location at which the first micro light emitting device 120 is scheduled to be installed. Then, a metal material may be deposited inside the first contact hole W1 by using a method such as spray or sputtering, to form a first connecting electrode E1 (as shown in FIG. 17).

In some embodiments, a material of the photoresist layer 140a may be but is not limited to a transparent photoresist material.

In some embodiments, in the patterning step (as shown in FIG. 20), the entire photoresist layer 140a is patterned by using a lithographic and etching process, to form a insular patterned photoresist layer 140. Then, the first opening H1 that penetrates through the patterned photoresist layer 140 is formed corresponding to a location of the first micro light emitting device 120; and the second opening H2 that penetrates through the patterned photoresist layer 140 is formed on a side adjacent to the first opening H1. In the vertical projection direction orientated towards the substrate 110, a projection of the first opening H1 at least partially overlaps a projection of a portion of the first micro light emitting device 120. The first opening H1 exposes a portion of the first micro light emitting device 120. The second opening H2 does not correspond to the first micro light emitting device 120, and does not expose the first micro light emitting device 120, but exposes a portion of the insulation layer 180.

In some embodiments, a conductive material may be deposited on the substrate 110 by using a method such as evaporation, chemical vapor deposition (CVD), or sputtering, to form the reflective electrode 150 (which covers the patterned photoresist layer 140) (as shown in FIG. 21). In some embodiments, the reflective electrode 150 may have electric conductivity and reflection, and may be used to reflect light. The reflective electrode 150 may be a single-layer structure or a multi-layer structure, and a material of the reflective electrode 150 may be but is not limited to metal, alloy, or another proper material.

In some embodiments, an insulating material may be deposited on the substrate 110 by using a method such as plasma deposition or the CVD, to form the protective layer 160. Then, the third opening H3 is formed at a location that is on the protective layer 160 and that corresponds to the second micro light emitting device 130, to expose a portion of the second micro light emitting device 130 (as shown in FIG. 23). In some embodiments, the protective layer 160 may be a single-layer structure or a multi-layer structure, and a material of the protective layer 160 may be, for example, an inorganic material (such as SiOx, SiNx, SiON, or another proper material, or a combination of the foregoing), an organic material (such as photoresist (including colored photoresist or transparent photoresist), polyimide, benzocyclobutene (BCB), Epoxy, Fluorinated butane (PFCB), or another proper material, or a combination of the foregoing).

In some embodiments, a conductive material may be deposited on the protective layer 160 by using a method such as the evaporation, the CVD, or the sputtering, to form the first conductive electrode 170. Herein, the first conductive electrode 170 covers the protective layer 160, and penetrates through the protective layer 160 through the third opening H3, to electrically connect an electrode (such as the fourth electrode 134, as shown in FIG. 24) of the second micro light emitting device 130. In some embodiments, a conductive material of the first conductive electrode 170 may be a transparent conductive material (such as Indium tin oxide, Indium zinc oxide, aluminium tin oxide, aluminium zinc oxide, indium germanium zinc oxide, or another proper oxide, or a stack layer of at least two of the foregoing; or a nano carbon pipe/bar, an organic conductive material, or a reflective material whose thickness is less than 60 Angstrom, or another proper oxide, or a stack layer of at least two of the foregoing). The conductive material may also include a reflective conductive material (for example, the material of the reflective electrode 150 may be used) or a transflective and semi-reflective conductive material (for example, the transparent conductive material and the reflective conductive material are used in a portion of the first conductive electrode 170).

In summary, according to the dual-sided display and the method for fabricating the same in the embodiments of the present disclosure, the patterned photoresist layer is used to enable the reflective electrode to be coupled to the first micro light emitting device and the second micro light emitting device. In addition, the reflective electrode forms a reflective surface, to respectively guide light emitted by the first micro light emitting device and light emitted by the second micro light emitting device to two opposite sides of the dual-sided display, so as to prevent the light emitted by the first micro light emitting device and the light emitted by the second micro light emitting device from interfering with each other, independently control the first micro light emitting device and the second micro light emitting device, and prevent, during dual-sided displaying, the dual-sided display from generating an image mirror.

Although the technical content of the present disclosure is already disclosed in preferred embodiments above, the preferred embodiments are not used to limit the present disclosure. Some modifications and improvements made by a person skilled in the art without departing from the spirit of the present disclosure should fall within the scope of the present disclosure. Therefore, the protection scope of the present disclosure should be subject to that defined by the attached claims.

What is claimed is:

1. A dual-sided display, having a plurality of sub-pixels disposed on a substrate, wherein each of the sub-pixels comprises:
    a first active device, disposed on the substrate;
    a first micro light emitting device, located on the substrate, comprising a first electrode, a second electrode, and a first light emitting layer, wherein the first light emitting layer is electrically connected to the first electrode and the second electrode, and the second electrode is electrically connected to the first active device;
    a patterned photoresist layer, disposed on the substrate, comprising a first opening and a second opening, wherein the first opening overlaps the first micro light emitting device;
    a reflective electrode, disposed on the substrate, covering the first micro light emitting device, the patterned photoresist layer, and the second opening, wherein the reflective electrode is electrically connected to the first electrode through the first opening;
    a second micro light emitting device, disposed on the reflective electrode, comprising a third electrode, a fourth electrode, and a second light emitting layer, wherein the second light emitting layer is electrically connected to the third electrode and the fourth electrode;
    a protective layer, disposed on the substrate, comprising a third opening, wherein the protective layer covers the reflective electrode and the second micro light emitting device, and the third opening overlaps with the second micro light emitting device; and
    a first conductive electrode, disposed on the protective layer, wherein the first conductive electrode covers the protective layer and is electrically connected to the fourth electrode through the third opening.

2. The dual-sided display according to claim 1, wherein the patterned photoresist layer has a plurality of side surfaces, there is an acute angle between one of the side surfaces and an upper surface of the substrate, and the acute angle is between 40° and 70°.

3. The dual-sided display according to claim 1, wherein the first active device and the first micro light emitting device are not overlapped.

4. The dual-sided display according to claim 1, wherein each of the sub-pixels further comprises:
    an insulation layer, covering the first active device and the substrate, wherein the insulation layer has a first contact hole, the first active device is electrically connected to the second electrode through the first contact hole, and the patterned photoresist layer is disposed on the insulation layer.

5. The dual-sided display according to claim 4, wherein each of the sub-pixels further comprises:
    a second active device, disposed on the substrate, wherein the insulation layer covers the second active device, the insulation layer further comprises a second contact hole, and the second active device is electrically connected to the fourth electrode through the second contact hole and the first conductive electrode.

6. The dual-sided display according to claim 5, wherein the second active device and the first micro light emitting device are not overlapped.

7. The dual-sided display according to claim 1, wherein the reflective electrode is a common electrode or a floating electrode.

8. The dual-sided display according to claim 1, wherein the first conductive electrode transmits a first potential.

9. The dual-sided display according to claim 1, wherein at least one of the sub-pixels comprises at least one light emitting area and at least one transparent area adjacent to each other, and the first micro light emitting device and the second micro light emitting device are located in the light emitting area.

10. The dual-sided display according to claim 9, wherein each of the sub-pixels further comprises:
    a light modulation device, disposed in the transparent area, comprising a second conductive electrode, a third conductive electrode, and a light modulation layer, wherein the light modulation layer is disposed between the second conductive electrode and the third conductive electrode, and the light modulation layer comprises a liquid crystal layer, an electrochromic layer, or an electrowetting layer.

11. The dual-sided display according to claim 10, wherein each of the sub-pixels further comprises:
    a switch device, located in the light emitting area; and
    an insulation layer, covering the first active device, the switch device, and the substrate, comprising a first contact hole and a through-hole, wherein the first active device is electrically connected to the first electrode through the first contact hole, the switch device is electrically connected to the second conductive electrode through the through-hole, and the patterned photoresist layer is disposed on the insulation layer.

12. The dual-sided display according to claim 11, wherein the switch device and the first micro light emitting device are not overlapped.

13. The dual-sided display according to claim 10, wherein each of the sub-pixels further comprises:
    a second active device, located in the light emitting area; and
    an insulation layer, covering the first active device, the second active device, and the substrate, comprising a first contact hole and a second contact hole, wherein the first active device is electrically connected to the first electrode through the first contact hole, the second active device is electrically connected to the fourth electrode through the second contact hole and the first conductive electrode, and the patterned photoresist layer is disposed on the insulation layer.

14. The dual-sided display according to claim 13, further comprising:
a switch device, disposed on the substrate, wherein the insulation layer covers the switch device, the insulation layer further comprises a third contact hole, and the switch device is electrically connected to the second conductive electrode through the third contact hole.

15. The dual-sided display according to claim 14, wherein the switch device and the first micro light emitting device are not overlapped.

16. The dual-sided display according to claim 13, wherein the second active device and the first micro light emitting device are not overlapped.

17. The dual-sided display according to claim 10, wherein the first conductive electrode is connected to the second conductive electrode, and the third conductive electrode is disposed in the light emitting area and the transparent area.

18. The dual-sided display according to claim 1, wherein the first micro light emitting device emits a first color, the second micro light emitting device emits a second color, the first color is red, blue, or green, the second color is white, and a first beam emitted by the first micro light emitting device and a second beam emitted by the second micro light emitting device are in opposite directions.

19. A method for fabricating a dual-sided display, comprising:
forming a first active device in a light emitting area of a substrate; disposing a first micro light emitting device on the light emitting area of the substrate, wherein the first micro light emitting device is electrically connected to the first active device; forming a photoresist layer on the substrate covering the first micro light emitting device; patterning the photoresist layer to form a patterned photoresist layer, wherein the patterned photoresist layer covers the first micro light emitting device, and the patterned photoresist layer has a first opening and a second opening; covering a reflective electrode on the patterned photoresist layer and the second opening, wherein the reflective electrode is coupled to the first micro light emitting device through the first opening; disposing a second micro light emitting device on the reflective electrode inside the second opening; forming a protective layer covering the reflective electrode and a portion of the second micro light emitting device, wherein the protective layer has a third opening; and forming a first conductive electrode on the protective layer, wherein the first conductive electrode is electrically connected to the second micro light emitting device through the third opening.

20. The method for fabricating a dual-sided display according to claim 19, wherein the step of the disposing the first micro light emitting device on the light emitting area of the substrate, and the first micro light emitting device is electrically connected to the first active device further comprises:
forming an insulation layer covering the first active device, wherein the insulation layer has a first contact hole; and
forming a first connecting electrode in the first contact hole.

* * * * *